United States Patent
Park et al.

(10) Patent No.: US 11,365,348 B2
(45) Date of Patent: Jun. 21, 2022

(54) QUANTUM DOT, PRODUCTION METHOD THEREOF, AND ELECTRONIC DEVICE INCLUDING THE SAME

(71) Applicant: SAMSUNG ELECTRONICS CO., LTD., Suwon-si (KR)

(72) Inventors: Young Seok Park, Yongin-si (KR); Eun Joo Jang, Suwon-si (KR); Shin Ae Jun, Seongnam-si (KR); Nayoun Won, Suwon-si (KR); Jooyeon Ahn, Suwon-si (KR); Sung Woo Kim, Hwaseong-si (KR)

(73) Assignees: SAMSUNG ELECTRONICS CO., LTD., Gyeonggi-Do (KR); SAMSUNG DISPLAY CO., LTD., Gyeonggi-Do (KR); SAMSUNG SDI CO., LTD., Gyeonggi-Do (KR)

( * ) Notice: Subject to any disclaimer, the term of this patent is extended or adjusted under 35 U.S.C. 154(b) by 205 days.

(21) Appl. No.: 16/245,653

(22) Filed: Jan. 11, 2019

(65) Prior Publication Data
US 2019/0211262 A1    Jul. 11, 2019

(30) Foreign Application Priority Data
Jan. 11, 2018   (KR) ................... 10-2018-0003830

(51) Int. Cl.
   C09K 11/70    (2006.01)
   C09K 11/02    (2006.01)
   (Continued)

(52) U.S. Cl.
   CPC ............. *C09K 11/70* (2013.01); *C09K 11/02* (2013.01); *C09K 11/025* (2013.01);
   (Continued)

(58) Field of Classification Search
None
See application file for complete search history.

(56) References Cited

U.S. PATENT DOCUMENTS 7,621,997 B2   11/2009   Jun et al.
7,964,278 B2   6/2011   Banin et al.
(Continued)

FOREIGN PATENT DOCUMENTS

CN    106701059 A    5/2017
EP    3375838 A1    9/2018
(Continued)

OTHER PUBLICATIONS

Francesca Pietra et al., "Tuning the Lattice Parameter of InxZnyP for Highly Luminescent Lattice-Matched Core/Shell Quantum Dots", ACS NANO, Apr. 11, 2016, pp. 4754-4762, Vo. 10, No. 4.
(Continued)

*Primary Examiner* — Thanh Nhan P Nguyen
(74) *Attorney, Agent, or Firm* — Cantor Colburn LLP

(57) ABSTRACT

A quantum dot includes a core including a first semiconductor nanocrystal and a multi-layered shell disposed on the core and including at least two layers, a production method thereof, and an electronic device including the same. The quantum dot does not include cadmium; the first semiconductor nanocrystal includes a Group III-V compound, the multi-layered shell includes a first layer surrounding at least a portion of a surface of the core, the first layer including a second semiconductor nanocrystal, the second semiconductor nanocrystal including a Group II-V compound, and a second layer disposed on the first layer, the second layer including a third semiconductor nanocrystal, the third semiconductor nanocrystal comprising a composition different from that of the second semiconductor nanocrystal.

25 Claims, 12 Drawing Sheets

Core: a Group III-V compound such as InP or InZnP
First layer of shell: a Group II-V compound such as $Zn_3P_2$
Second layer of shell: a Group II-VI compound such as ZnSeS

(51) Int. Cl.
*H01L 27/32* (2006.01)
*G02F 1/13357* (2006.01)
*F21V 8/00* (2006.01)
*C09K 11/88* (2006.01)
*H05B 33/14* (2006.01)

(52) U.S. Cl.
CPC ............ *C09K 11/883* (2013.01); *G02B 6/005* (2013.01); *G02F 1/133617* (2013.01); *H01L 27/322* (2013.01); *H05B 33/14* (2013.01)

(56) References Cited

U.S. PATENT DOCUMENTS

| | | | |
|---|---|---|---|
| 8,247,795 B2 | 8/2012 | Jun et al. | |
| 8,343,576 B2 | 1/2013 | Banin et al. | |
| 8,609,245 B2 | 12/2013 | Jang et al. | |
| 8,847,201 B2 | 9/2014 | Char et al. | |
| 9,637,682 B2 | 5/2017 | Jun et al. | |
| 2006/0236918 A1 | 10/2006 | Jun et al. | |
| 2008/0252209 A1 | 10/2008 | Jang et al. | |
| 2010/0132770 A1 | 6/2010 | Beatty et al. | |
| 2010/0140586 A1 | 6/2010 | Char et al. | |
| 2010/0159248 A1* | 6/2010 | Jang | C09K 11/70 428/403 |
| 2010/0289003 A1 | 11/2010 | Kahen et al. | |
| 2014/0117292 A1* | 5/2014 | Jun | H01L 31/0304 252/519.14 |
| 2014/0158982 A1* | 6/2014 | Park | H01L 33/50 257/13 |
| 2014/0242676 A1 | 8/2014 | Abdel-Fattah et al. | |
| 2015/0083969 A1 | 3/2015 | Kim et al. | |
| 2017/0183565 A1* | 6/2017 | Jun | C08K 3/32 |
| 2017/0237029 A1 | 8/2017 | Jun et al. | |
| 2018/0072942 A1* | 3/2018 | Yamada | C09K 11/08 |
| 2018/0142149 A1* | 5/2018 | Youn | C09K 11/70 |

FOREIGN PATENT DOCUMENTS

| | | |
|---|---|---|
| JP | 2011505432 A | 2/2011 |
| KR | 0722086 B1 | 5/2007 |
| KR | 0817853 B1 | 3/2008 |
| KR | 20080094097 A | 10/2008 |
| KR | 1060233 B1 | 8/2011 |
| KR | 1159853 B1 | 6/2012 |
| KR | 1374512 B1 | 3/2014 |
| KR | 1462658 B1 | 11/2014 |
| KR | 1537296 B1 | 7/2015 |
| WO | 2017082116 A1 | 5/2017 |

OTHER PUBLICATIONS

Extended European Search Report dated Jun. 18, 2019, of the corresponding European Patent Application No. 19151364.7.

S.Sudhakar et al., "Influence of cooling rate on the liquid-phase epitaxial growth of Zn3P2," Journal of Crystal Growth, 2008, pp. 2707-2711, vol. 310.

Sungwoo Kim et al., "Highly Luminescent InP/GaP/ZnS Nanocrystals and Their Application to White Light-Emitting Diodes," Journal of the American Chemical Society, Feb. 3, 2012, pp. 3804-3809, vol. 134.

* cited by examiner

Core: a Group III-V compound such as InP or InZnP
First layer of shell: a Group II-V compound such as $Zn_3P_2$
Second layer of shell: a Group II-VI compound such as ZnSeS

QUANTUM DOT, PRODUCTION METHOD THEREOF, AND ELECTRONIC DEVICE INCLUDING THE SAME

CROSS-REFERENCE TO RELATED APPLICATION

This application claims priority to Korean Patent Application No. 10-2018-0003830, filed in the Korean Intellectual Property Office on Jan. 11, 2018, and all the benefits accruing therefrom under 35 U.S.C. § 119, the content of which is incorporated herein in its entirety by reference.

BACKGROUND

1. Field

A quantum dot, a production method thereof, and an electronic device including the same are disclosed.

2. Description of the Related Art

A semiconductor nanocrystal particle also known as a quantum dot is a semiconductor material having a crystalline structure of several nanometers or several tens of nanometers. The quantum dot exhibits a quantum confinement effect and has properties different from a bulk material having the same composition. For example, physical properties of the quantum dot (e.g., an energy bandgap), which are intrinsic for a bulk material, may be controlled. The quantum dot may absorb light from an excitation source to be excited, and may emit energy corresponding to the energy bandgap of the quantum dots.

SUMMARY

An embodiment provides a quantum dot that may show improved photoluminescence properties.

An embodiment provides a composition including the quantum dot.

An embodiment provides a quantum dot-polymer composite including the quantum dot.

An embodiment provides a display device including the quantum dot or the quantum dot-polymer composite.

An embodiment provides a production method of the quantum dot.

An embodiment provides an electronic device including the quantum dot.

In an embodiment, a quantum dot includes a core including a first semiconductor nanocrystal and a multi-layered shell disposed on the core and having at least two layers, wherein the quantum dot does not include cadmium, and wherein the first semiconductor nanocrystal includes a Group III-V compound, the multi-layered shell includes a first layer surrounding at least a portion of a surface of the core, the first layer including a second semiconductor nanocrystal, the second semiconductor nanocrystal including a Group II-V compound, and a second layer disposed on the first layer, the second layer including a third semiconductor nanocrystal, the third semiconductor nanocrystal including a composition different from that of the second semiconductor nanocrystal.

The Group III-V compound may include indium (In) and phosphorous (P).

The Group III-V compound may further include zinc.

The zinc may be alloyed or doped in an indium phosphide.

In the quantum dot, a molar ratio (i.e., a molar amount) of phosphorous with respect to indium may be greater than or equal to about one (1).

A bulk energy bandgap of the second semiconductor nanocrystal may be greater than or equal to a bulk energy bandgap of the first semiconductor nanocrystal and less than a bulk energy bandgap of the third semiconductor nanocrystal.

The second semiconductor nanocrystal may include a zinc phosphide (e.g., $Zn_2P_3$, $ZnP_2$, or the like).

The second semiconductor nanocrystal may further include a Group IIIA metal other than indium (e.g., Al, Ga, Tl, or the like), a Group IV element (e.g., Ge, Sn, or the like), titanium, iron, or a combination thereof.

A thickness of the first layer may be less than or equal to about three (3) monolayers.

The first layer may be disposed directly on the surface of the core.

The second semiconductor nanocrystal may exhibit a peak assigned to the Group II-V compound in an XPS analysis.

The third semiconductor nanocrystal may include a Group II-VI compound.

The third semiconductor nanocrystal may include ZnSe, ZnSeS, ZnS, or a combination thereof.

The second layer may have a composition varying in a radial direction.

A thickness of the second layer may be greater than or equal to about one monolayer.

The multi-layered shell may include a third layer that is disposed on the second layer, the third layer includes a fourth semiconductor nanocrystal having a composition that is different from the third semiconductor nanocrystal.

The fourth semiconductor nanocrystal may include a compound having an energy bandgap greater than that of the third semiconductor nanocrystal.

The compound may include ZnS.

The quantum dot may not include fluorine, boron, or a combination thereof.

The quantum dot may not include a halogen.

A quantum efficiency of the quantum dot may be greater than or equal to about 65%.

A quantum efficiency of the quantum dot may be greater than or equal to about 70%.

A size of a particle including the core (e.g., an InP core) and the first layer formed thereon may be greater than or equal to about 1 nanometers (nm) (for example, greater than or equal to about 1.5 nm, greater than or equal to about 1.7 nm, greater than or equal to about 1.8 nm, greater than or equal to about 1.9 nm, or greater than or equal to about 2.0 nm).

A size of a particle including the core (e.g., an InP core) and the first layer formed thereon may be less than or equal to about 4 nm (for example, less than or equal to about 3.5 nm, less than or equal to about 3 nm, less than or equal to about 2.9 nm, less than or equal to about 2.8 nm, less than or equal to about 2.7 nm, less than or equal to about 2.6 nm, or less than or equal to about 2.5 nm).

A plurality of quantum dots may have a standard deviation of a size distribution of less than or equal to about 20%.

An average size of the quantum dots may be greater than or equal to about 3 nm.

An average size of the quantum dots may be less than or equal to about 5 nm, for example, less than or equal to about 4.9 nm, less than or equal to about 4.8 nm, less than or equal to about 4.7 nm, less than or equal to about 4.6 nm, or less than or equal to about 4.5 nm.

The quantum dot may include zinc, and a photoluminescent peak wavelength of the quantum dot may be in a range of greater than or equal to about 490 nm and less than or equal to about 550 nm.

A size of the quantum dot may be greater than or equal to about 5.5 nm (for example, greater than or equal to about 6 nm or greater than or equal to about 7 nm).

A size of the quantum dot may be less than or equal to about 8 nm (for example, less than or equal to about 7 nm or less than or equal to about 6.5 nm).

In the quantum dot of an embodiment, the Group III-V compound may include (e.g., essentially consists of) an indium phosphide and optionally zinc; the second semiconductor nanocrystal may include (e.g., essentially consists of) a zinc phosphide; and the third semiconductor nanocrystal may include (e.g., essentially consists of) ZnSe, ZnSeS, ZnS, or a combination thereof.

In an embodiment, a method of producing the aforementioned quantum dot includes, obtaining a first mixture including a core including a first semiconductor nanocrystal, a Group II metal precursor, an organic ligand, and an organic solvent;

heating the first mixture at an activation temperature;

injecting a Group V non-metal precursor to the heated first mixture to obtain a second mixture;

heating the second mixture at a first reaction temperature to form a particle having a first layer including a second semiconductor nanocrystal including a Group II-V compound on a surface of the core;

preparing a third mixture including the particle having a first layer including a Group II-V compound on a surface of the core, a metal and a non-metal precursor for a third semiconductor nanocrystal, an organic ligand, and an organic solvent; and heating the third mixture at a second reaction temperature to form the third semiconductor nanocrystal having a composition different from that of the second semiconductor nanocrystal on the first layer.

The Group II metal precursor may include a Zn metal powder, an alkylated Zn compound, Zn alkoxide, Zn carboxylate, Zn nitrate, Zn perchlorate, Zn sulfate, Zn acetylacetonate, Zn halide, Zn cyanide, Zn hydroxide, Zn oxide, Zn peroxide, or a combination thereof.

The Group V non-metal precursor may include tris(trimethylsilyl)phosphine, tris(dimethylamino)phosphine, triethylphosphine, tributylphosphine, trioctylphosphine, triphenylphosphine, tricyclohexylphosphine, arsenic oxide, arsenic chloride, arsenic sulfate, arsenic bromide, arsenic iodide, nitric oxide, nitric acid, ammonium nitrate, or a combination thereof.

The first mixture may not include an indium precursor as a metal precursor. The indium precursor may be excluded from the first mixture.

The method may further include adding a dopant precursor to the first mixture.

The dopant precursor may include a Group IIIA metal other than indium (e.g., Al, Ga, Tl, or the like), a Group IV element, titanium, iron, or a combination thereof.

The activation temperature may be greater than or equal to about 90° C. and less than or equal to about 150° C.

The first reaction temperature may be greater than or equal to about 150° C. and less than or equal to about 300° C.

The second reaction temperature may be greater than or equal to about 200° C. and less than or equal to about 350° C.

In an embodiment, a composition includes:
(e.g., a plurality of) the aforementioned cadmium free quantum dot(s);
a carboxylic acid group-containing binder;
a polymerizable (e.g., photopolymerizable) monomer including a carbon-carbon double bond; and
an initiator (e.g., a photoinitiator).

In an embodiment, a quantum dot polymer composite includes a polymer matrix; and a plurality of quantum dots dispersed in the polymer matrix, wherein the plurality of quantum dots include the aforementioned quantum dot.

The polymer matrix may include a crosslinked polymer, a binder polymer including a carboxylic acid group, or a combination thereof.

The crosslinked polymer may include a polymerization product of a photopolymerizable monomer including at least carbon-carbon double bond, a polymerization product of the photopolymerizable monomer and a multi-thiol compound having at least two thiol groups at the terminal end of the multi-thiol compound, or a combination thereof.

The plurality of the quantum dots may not include cadmium.

The quantum dot polymer composite may include a metal oxide fine particle in the polymer matrix.

In an embodiment, a display device includes a light source and a light emitting element (e.g., photoluminescence element), wherein the light emitting element includes the aforementioned quantum dot-polymer composite and the light source is configured to provide the light emitting element with incident light.

The incident light may have a luminescence peak wavelength of about 440 nm to about 460 nm.

In an embodiment, the light emitting element may include a sheet of the quantum dot polymer composite.

The display device may further include a liquid crystal panel, and a sheet of the quantum dot polymer composite may be disposed between the light source and the liquid crystal panel.

In an embodiment, the display device includes as the light emitting element a stacked structure including a substrate and a light emitting layer disposed on the substrate, wherein the light emitting layer includes a pattern of the quantum dot polymer composite and the pattern includes at least one repeating section configured to emit light at a predetermined wavelength.

The display device (e.g., the light emitting element) may be configured to have a color reproducibility of greater than or equal to about 80% measured in accordance with a BT2020 standard.

The pattern may include a first section configured to emit a first light and a second section configured to emit a second light having a different center wavelength from the first light.

The light source may include a plurality of light-emitting units corresponding to each of the first section and the second section, wherein the light-emitting units may include a first electrode and a second electrode facing each other and an electroluminescence layer disposed between the first electrode and the second electrode.

The display device may further include a lower substrate, a polarizer disposed under the lower substrate, and a liquid crystal layer disposed between the stacked structure and the lower substrate, wherein the stacked structure is disposed so that the light emitting layer faces the liquid crystal layer.

The display device may further include a polarizer between the liquid crystal layer and the light emitting layer.

The light source may include a light emitting diode (LED) and optionally a light guide panel (LGP).

In an embodiment, a cadmium free quantum dot includes a core including an indium phosphide and a first shell disposed on the core and including a Group II-V compound, wherein a molar amount of phosphorous with respect to indium is greater than or equal to 1, for example, greater than or equal to about 1.1 and having a zinc blend crystalline structure.

The core may further include zinc.

The cadmium free quantum dot may include an additional amorphous or crystalline shell disposed on the first shell.

The cadmium free quantum dot may have a molar amount (i.e., a molar ratio) of zinc with respect to the indium that is greater than or equal to about 10.

The cadmium free quantum dot may not include fluorine, boron, or a combination thereof.

The cadmium free quantum dot may not include a halogen.

The cadmium free quantum dot may exhibit a quantum efficiency of greater than or equal to about 65%.

The quantum dots may be prepared in a simplified process (e.g., without using a corrosive material such as a fluorine based compound) and even when they have a relatively thin shell (e.g., when they do not include a multi-layered thick shell based on ZnSeS) they may show enhanced luminous properties (e.g., improved quantum efficiency).

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
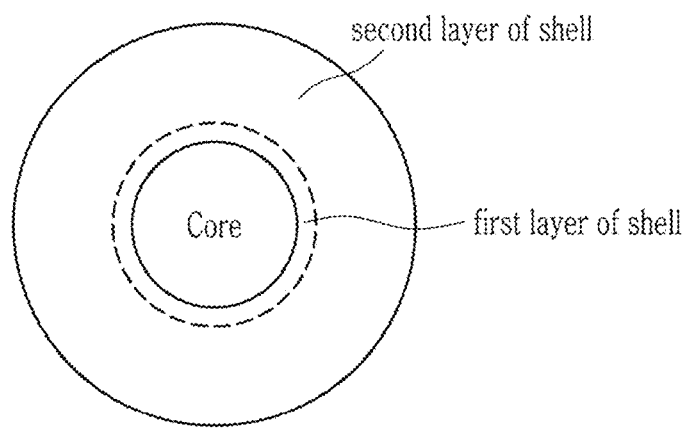
FIG. 1 is a view illustrating a schematic cross-section of a quantum dot of an embodiment.

Advantages and characteristics of this disclosure, and a method for achieving the same, will become evident referring to the following example embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising" will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, unless a definition is otherwise provided, the term "substituted" refers to a compound or a group or a moiety wherein at least one hydrogen atom thereof is substituted with a substituent. The substituent may include a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR', wherein R and R' are the same or different, and are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$), a group represented by the formula =N—R (wherein R is hydrogen or a C1 to C10 linear or branched alkyl group), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxylic acid group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, "doping" may refer to inclusion of a dopant without bring forth a substantial change of an original crystal structure. For example, a given atom may be substituted for a portion of the corresponded crystal structure or exist as an interstitial atom between the crystal lattices. An X-ray diffraction (XRD) spectrum of a doped product may not exhibit any substantial changes, for example, resulting from a dopant. The dopant may not exhibit a substantial crystalline peak in an X-ray diffraction spectrum. The presence of the dopant element may be confirmed by an X-ray photoelectron spectroscopy, an energy dispersive X-ray spectroscopy and/or inductively coupled atom light emitting spectroscopy (ICP-AES).

As used herein, unless a definition is otherwise provided, the term "hetero" means that the compound or group includes at least one (e.g., one to three) heteroatom(s), wherein the heteroatom(s) is each independently N, O, S, Si, P, or a combination thereof.

As used herein, unless a definition is otherwise provided, the term "aliphatic hydrocarbon group" refers to a C1 to C30 linear or branched alkyl group, C2 to C30 linear or branched alkenyl group, and C2 to C30 linear or branched alkynyl group, the term "aromatic hydrocarbon group" refers to a C6 to C30 aryl group or a C2 to C30 heteroaryl group, and the term "alicyclic hydrocarbon group" refers to a C3 to C30 cycloalkyl group, a C3 to C30 cycloalkenyl group, and a C3 to C30 cycloalkynyl group.

As used herein, unless a definition is otherwise provided, the term "(meth)acrylate" refers to acrylate and/or methacrylate. The (meth)acrylate may include a (C1 to C10 alkyl)acrylate and/or a (C1 to C10 alkyl)methacrylate.

As used herein, unless a definition is otherwise provided, the term "Group" in the term Group III, Group II, and the like refers to a group of the Periodic Table of Elements.

As used herein, "Group I" refers to Group IA and Group IB, and may include Li, Na, K, Rb, and Cs but are not limited thereto.

As used herein, "Group II" refers to Group IIA and a Group IIB, and examples of the Group II metal may include Cd, Zn, Hg, and Mg, but are not limited thereto.

As used herein, "Group III" refers to Group IIIA and Group IIIB, and examples of the Group III metal may include Al, In, Ga, and Tl, but are not limited thereto.

As used herein, "Group IV" refers to Group IVA and Group IVB, and examples of the Group IV metal may include Si, Ge, and Sn but are not limited thereto. As used herein, the term "a metal" may include a semi-metal such as Si.

As used herein, "Group V" refers to Group VA and may include nitrogen, phosphorus, arsenic, antimony, and bismuth but is not limited thereto.

As used herein, "Group VI" refers to Group VIA and may include sulfur, selenium, and tellurium, but is not limited thereto.

Quantum dots having a relatively small size have a relatively large surface area per a unit volume in comparison with a bulk crystalline material. Therefore, the quantum dots may include a large number of defects on a surface thereof, which may lead to a decrease in a luminous property and/or deterioration of (thermal and chemical) stability. A core-shell type quantum dot may address this issue, but developing a technology for improving quality thereof (e.g., improvement of luminous properties and chemical/thermal stability) may be desired.

For example, in order to enhance a luminous efficiency of a quantum dot (e.g., a core), etching and/or modifying a surface thereof with a corrosive substance (e.g., a halide based acid or a metal salt) may reduce the number of surface defects. However, a halogen or a halide remaining on the quantum dot may have an adverse effect on its application of the quantum dot in a device. Moreover, while a relatively thick shell may be desired for securing a desired level of luminous efficiency and stability, the relatively thick shell may also add difficulties on the production of the quantum dots. For example, a multi-layered shell coating for a desired thickness of the shell makes it difficult for the resulting quantum dot to have a controlled particle size/composition.

In an embodiment, a quantum dot includes a core including a first semiconductor nanocrystal and a multi-layered shell disposed on the core and having at least two layers, wherein the first semiconductor nanocrystal includes a Group III-V compound, the multi-layered shell includes a first layer surrounding at least a portion of a surface of the core and including a second semiconductor nanocrystal that includes a Group II-V compound (e.g., a metal phosphide), and a second layer disposed on the first layer and including a third semiconductor nanocrystal that has a composition different from that of the second semiconductor nanocrystal. The quantum dot does not include cadmium. FIG. 1 illustrates a schematic cross-sectional view of a quantum dot of an embodiment. Referring to FIG. 1, the third semiconductor nanocrystal includes a Group II-VI compound, but the quantum dot is not limited thereto. In FIG. 1, the core can be a Group III-V compound such as InP or InZnP, the first layer of shell can be a Group II-V compound such as $Zn_3P_2$, and the second layer of shell can be a Group II-VI compound such as ZnSeS.

A quantum dot of an embodiment has a structure wherein an interlayer including a Group II-V compound (e.g., a metal phosphide) is provided at an interface between the core and the second layer of the shell. The Group II-V compound-based interlayer may play a role as a first surface passivation layer and thereby a luminous efficiency of the III-V core may increase prior to a subsequent shell coating and then an additional shell (e.g., based on a Group II-VI compound) may provide additional passivation. Thus, the quantum dot may have a reduced number of surface defects and thereby may show enhanced luminous properties. Accordingly, without wishing to be bound by any theory, it is believed that the quantum dot may be used in an optical film material and an electroluminescent device that may address a deterioration problem of charge carrier at a core/shell interface.

In addition, as described below, the first layer including the Group II-V compound may further include a different metal substituted and/or doped therein to provide a quantum dot having an interlayer of a various composition. The quantum dot may be used in a quantum dot based color filter. In addition, in the case of the quantum dot, the number of defects may decrease even without using a highly corrosive substance such as a halide compound and thereby the deterioration of charge carrier due to the halide may be prevented. Accordingly, the quantum dot may show enhanced electroluminescent properties or photoelectric properties.

The Group III-V compound semiconductor may be:

a binary element compound of GaN, GaP, GaAs, GaSb, AlN, AlP, AlAs, AlSb, InN, InP, InAs, InSb, or a combination thereof;

a ternary element compound of GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; or a quaternary element compound of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof.

In an embodiment, the Group III-V compound may include indium and phosphorous (e.g., an indium phosphide). The Group III-V compound may further include zinc that is alloyed or doped in the indium phosphide. For example, the Group III-V compound may include InZnP. In the quantum dot, a molar ratio of phosphorous with respect to indium may be greater than or equal to about 1:1, for example, greater than or equal to about 1.1:1, or greater than or equal to about 1.2:1.

The quantum dot may include a first layer disposed on the core and including a second semiconductor nanocrystal including a Group II-V compound (e.g., a metal phosphide). The first layer may be disposed directly on the core. The first layer may contribute to decreasing the number of defects on a surface of the core without use of a highly corrosive substance based on a halogen or a halide. In addition, even when the first layer has a relatively small thickness (e.g., of less than or equal to about 3 monolayers, of less than or equal to about 2 monolayers, or even with one monolayer), it may be possible to achieve substantial improvement of the luminous efficiency of the core. Without wishing to be bound by any theory, it is also believed that the first layer plays a role of a surface passivation and thereby may help the subsequent formation of the shell having a relatively large thickness.

The second semiconductor nanocrystal may include a zinc phosphide compound. The zinc phosphide compound may include $Zn_3P_2$, $ZnP_2$, or a combination thereof. A direct bulk energy bandgap of the second semiconductor nanocrystal may be greater than or equal to a bulk energy bandgap of the first semiconductor nanocrystal and less than a bulk energy bandgap of the third semiconductor nanocrystal. In an embodiment, the first semiconductor nanocrystal may be a indium phosphide having a bulk energy bandgap of about 1.34 electronvolts (eV), and the direct bulk energy bandgap of the second semiconductor nanocrystal may be greater than about 1.34 eV, for example, greater than or equal to about 1.4 eV, or greater than or equal to about 1.45 eV (e.g., 1.5 eV or higher).

The first layer may have a thickness of less than or equal to about 3 monolayers, for example, less than or equal to about 2 monolayers. The thickness of the first layer may be greater than or equal to about 1 monolayers. The first layer may provide a first effective passivation for the core even when the first layer has a relatively small thickness, thereby enhancing the luminous efficiency of the core and shortening a subsequent process of forming a second layer including a third semiconductor nanocrystal that will be described below.

Due to the presence of the second semiconductor nanocrystal, the X-ray photoelectron spectrum of the quantum dot may exhibit a peak that can be assigned to $Zn_3P_2$.

The second semiconductor nanocrystal may further include a dopant of a Group IIIA metal (e.g., Al, Ga, Tl, or a combination thereof) other than the indium, a Group IV element (e.g., Ge, Sn, or a combination thereof), titanium, iron, or a combination thereof. A molar amount of the dopant may be greater than or equal to about 0.1, greater than or equal to about 0.2, greater than or equal to about 0.3, greater than or equal to about 0.4, greater than or equal to about 0.5, greater than or equal to about 0.6, greater than or equal to about 0.7, or greater than or equal to about 0.8 per one mole of the metal of the first semiconductor nanocrystal (e.g., the indium). A molar amount (i.e., molar ratio) of the dopant may be less than about 2.0, less than or equal to about 1.9, less than or equal to about 1.5, less than or equal to about 1.1, or less than or equal to about 1. The presence of the dopant may contribute to increasing the luminous efficiency of the quantum dot.

On or over the first layer, a second layer including a third semiconductor nanocrystal may be disposed. The third semiconductor nanocrystal may include a Group II-VI compound, a Group III-V compound, a Group IV-VI compound, a Group IV element or compound, a Group compound, a Group I-II-IV-VI compound, or a combination thereof.

Examples of the Group III-V compound are the same as set forth above.

The Group II-VI compound may be:

a binary element compound of ZnS, ZnSe, ZnTe, ZnO, HgS, HgSe, HgTe, MgSe, MgS, or a combination thereof;

a ternary element compound of ZnSeS, ZnSeTe, ZnSTe, HgSeS, HgSeTe, HgSTe, HgZnS, HgZnSe, HgZnTe, MgZnSe, MgZnS, or a combination thereof; or a quaternary element compound of HgZnTeS, ZnTeSeS, HgZnSeS, HgZnSeTe, HgZnSTe, or a combination thereof.

The Group II-VI compound may further include a Group III metal.

The Group III-V compound may further include a Group II metal (e.g., InZnP).

The Group IV-VI compound may be:

a binary element compound of SnS, SnSe, SnTe, PbS, PbSe, PbTe, or a combination thereof;

a ternary element compound of SnSeS, SnSeTe, SnSTe, PbSeS, PbSeTe, PbSTe, SnPbS, SnPbSe, SnPbTe, or a combination thereof; or a quaternary element compound of SnPbSSe, SnPbSeTe, SnPbSTe, or a combination thereof.

Examples of the Group compound may include $CuInSe_2$, $CuInS_2$, CuInGaSe, and CuInGaS, but are not limited thereto.

Examples of the Group I-II-IV-VI compound may include CuZnSnSe and CuZnSnS, but are not limited thereto.

The Group IV element or compound may include:

a single-element of Si, Ge, or a combination thereof; or a binary element compound of SiC, SiGe, or a combination thereof.

In an embodiment, the third semiconductor nanocrystal may include a Group II-VI compound. In an embodiment, the third semiconductor nanocrystal may include ZnSe, ZnS, ZnSeS, or a combination thereof. The second layer may have a composition varying in a radial direction. For example, the second layer may include ZnSeS, and the concentration of the sulfur may increase in a direction toward a surface of the quantum dot. The second layer may include a multi-layered structure such as ZnSe/ZnSeS/ZnS. A thickness of the second layer is not particularly limited and may be selected appropriately. A thickness of the second layer may be greater than or equal to about 0.5 nm, greater than or equal to about 1 nm, greater than or equal to about 1.5 nm, or greater than or equal to about 1.8 nm. A thickness of the second layer may be less than or equal to about 2.5 nm, for example, less than or equal to about 2 nm, less than or equal to about 1.8 nm, or less than or equal to about 1.5 nm.

In an embodiment, the multi-layered shell may further include a third layer that is disposed on the second layer and including a fourth semiconductor nanocrystal having a composition different from that of the third semiconductor nanocrystal. The fourth semiconductor nanocrystal may include a compound having an energy bandgap greater than that of the third semiconductor nanocrystal. The compound may include (or consist essentially of or consist of) ZnS. The third layer may consist of ZnS. The fourth semiconductor nanocrystal may include a Group II-VI compound, a Group III-V compound, a Group IV-VI compound, a Group IV element or compound, a Group compound, a Group I-II-IV-VI compound, or a combination thereof.

The quantum dot may have a particle size (e.g., a diameter) of greater than or equal to about 1 nm and less than or equal to about 100 nm. The particle size (or the diameter) may refer to an average size or an average diameter. In the case of a non-spherical shape, the size may be a diameter calculated from a two-dimensional area of a transmission electron microscopic image (e.g., assuming that the area forms a circle). In an embodiment, the (average) size of the quantum dot may be greater than or equal to about 1 nm, greater than or equal to about 2 nm, greater than or equal to about 3 nm, greater than or equal to about 4 nm, or greater than or equal to about 5 nm. The quantum dot may have a size (or an average size) of less than or equal to about 50 nm, less than or equal to about 45 nm, less than or equal to about 40 nm, less than or equal to about 35 nm, less than or equal to about 30 nm, less than or equal to about 25 nm, less than or equal to about 20 nm, less than or equal to about 15 nm, less than or equal to about 10 nm, less than or equal to about 9 nm, less than or equal to about 8 nm, less than or equal to about 7 nm, less than or equal to about 6 nm, or less than or equal to about 5 nm.

The quantum dot may be a member of a quantum dot population having an improved size distribution. In other words, the quantum dots may form a quantum dot population having an improved size distribution. A standard deviation of the size distribution of the quantum dot population may be less than 20%, for example, less than or equal to about 19%, or less than or equal to about 18% of the average size of the quantum dots. (For example, a standard deviation of the sizes/the average size may be less than 0.2, for example, less than or equal to about 0.19, or less than or equal to about 0.18)

In an embodiment, the quantum dot may have the core of about 1 nm to about 2 nm, and the size of the particle including the core and a first layer (e.g., a zinc phosphide layer) disposed thereon may be from about 2 nm to about 3 nm. In an embodiment, the (core-Zn P-second layer) quantum dot having the second layer may have a size of greater than or equal to about 4.0 nm and less than or equal to about 5.5 nm.

A shape of the quantum dot is not particularly limited. For example, the shape of the quantum dot may be a (substantially) spherical, pyramidal, a multi-pod, a polyhedron, a cubic, a cuboid, a nanotube, a nanowire, a nanofiber, a nanosheet, or a combination thereof.

The quantum dot may include an organic ligand. The organic ligand (or suitable organic solvent during a colloid synthesis) may be bound to a surface of the quantum dot. The organic ligand may include RCOOH, $RNH_2$, $R_2NH$, $R_3N$, RSH, $R_3PO$, $R_3P$, ROH, RCOOR', $RPO(OH)_2$, RHPOOH, $R_2POOH$ (wherein, R and R' are each independently a C1 to C40 (e.g., C3 to C24) substituted or unsubstituted aliphatic hydrocarbon group such as an alkyl or alkenyl group or a C6 to C40 (C6 to C20) substituted or unsubstituted aromatic hydrocarbon group such as an aryl group), a polymer organic ligand, or a combination thereof.

Examples of the organic ligand may be a thiol compound such as methane thiol, ethane thiol, propane thiol, butane thiol, pentane thiol, hexane thiol, octane thiol, dodecane thiol, hexadecane thiol, octadecane thiol, or benzyl thiol; an amine compounds such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, or trioctylamine; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine compound such as methyl phosphine, ethyl phosphine, propyl phosphine, butyl phosphine, pentyl phosphine, octyl phosphine, dioctyl phosphine, tributyl phosphine, or trioctyl phosphine; an oxide of a phosphine compound such methyl phosphine oxide, ethyl phosphine oxide, propyl phosphine oxide, butyl phosphine oxide, pentyl phosphine oxide, tributyl phosphine oxide, octyl phosphine oxide, dioctyl phosphine oxide, or trioctyl phosphine oxide; a diphenyl or triphenyl phosphine compound, or an oxide compound thereof; a C5 to C20 alkyl phosphonic acid; a C5 to C20 alkyl phosphinic acid, such as hexyl phosphinic acid, octyl phosphinic acid, dodecane phosphinic acid, tetradecane phosphinic acid, hexadecane phosphinic acid, octadecane phosphinic acid; and the like, but are not limited thereto. The quantum dot may include one or more hydrophobic organic ligands that can be the same or different. The organic ligand may not include a photopolymerizable moiety (e.g., acrylate group, (meth)acrylate group, etc.).

The quantum dot may not include fluorine, boron, or a combination thereof, i.e., may be free of fluorine, boron, or a combination thereof or have no fluorine, boron, or a combination thereof added. The quantum dot may not include a halogen, i.e., may be free of a halogen or have no halogen added. Without the inclusion of the foregoing, the quantum dot may exhibit an enhanced level of quantum efficiency. The quantum efficiency of the quantum dot may be greater than or equal to about 65%, greater than or equal to about 66%, greater than or equal to about 67%, greater than or equal to about 68%, greater than or equal to about 69%, or greater than or equal to about 70%.

A photoluminescent peak wavelength of the quantum dot may be greater than or equal to about 450 nm, for example, greater than or equal to about 480 nm, greater than or equal to about 500 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, or greater than or equal to about 600 nm and less than or equal to about 750 nm, for example, less than or equal to about 720 nm, less than or equal to about 700 nm, less than or equal to about 680 nm, less than or equal to about 670 nm, less than or equal to about 650 nm, less than or equal to about 640 nm, less than or equal to about 620 nm, less than or equal to about 600 nm, less than or equal to about 580 nm, less than or equal to about 570 nm, less than or equal to about 560 nm, or less than or equal to about 550 nm. The range of the wavelength of the PL peaks may be any combination of the foregoing. A photoluminescent peak wavelength of the quantum dot may be between about 450 nm and about 600 nm, between about 500 nm and about 580 nm, between about 520 nm and about 570 nm, between about 530 nm and about 560 nm, or between about 540 nm and about 550 nm. The photoluminescent peak wavelength of the quantum dot may be controlled by varying the size and/or the composition thereof. In an embodiment, the first semiconductor nanocrystal may be an indium phosphide, the quantum dot may emit light having a center wavelength from about 550 nm to about 650 nm, but it is not limited thereto. In an embodiment, the core may further include zinc and the center wavelength of the photoluminescent peak may be present in a range from about 500 nm to about 550 nm, but it is not limited thereto.

In an embodiment, while the quantum dot has a size of less than or equal to about 10 nm, for example, less than or equal to about 8 nm, less than or equal to about 7 nm, less than or equal to about 6 nm, or less than or equal to about 5 nm, the quantum dot may also satisfy the following composition(s) or a combination thereof.

The quantum dot may include phosphorous (P) in an amount of greater than or equal to about 0.9 moles, for example, greater than or equal to about 1 mole, greater than or equal to about 1.1 moles, or greater than or equal to about 1.15 moles and/or less than or equal to about 4 moles, less than or equal to about 3 moles, less than or equal to about 2.5 moles, or less than or equal to about 2 moles, per one mole of the main metal included in the first semiconductor nanocrystal, e.g., the metal included in the greatest amount in the first semiconductor nanocrystal or indium, for example, determined by an inductively coupled plasma atomic emission spectroscopy (ICP-AES) analysis.

The quantum dot may include zinc (Zn) in an amount of greater than or equal to about 9 moles, for example, greater than or equal to about 9.5 moles, greater than or equal to about 10 mole, or greater than or equal to about 11 moles and less than or equal to about 30 moles, less than or equal to about 20 moles, less than or equal to about 19 moles, less than or equal to about 18 moles, less than or equal to about 17 moles, less than or equal to about 16 moles, less than or equal to about 15 moles, less than or equal to about 14 moles, less than or equal to about 13 moles, or less than or equal to about 12 moles, per one mole of the main metal included in the first semiconductor nanocrystal, for example, determined by an inductively coupled plasma atomic emission spectroscopy (ICP-AES) analysis.

The quantum dot may include selenium in an amount of greater than or equal to about 0.3 moles, for example, greater than or equal to about 0.4 moles, greater than or equal to about 0.5 moles, or greater than or equal to about 0.6 moles and less than or equal to about 1.5 moles, less than or equal to about 1.4 moles, less than or equal to about 1.3 moles, less than or equal to about 1.2 moles, less than or equal to about 1.1 moles, less than or equal to about 1 moles, or less than or equal to about 0.95 moles, per one mole of the main metal included in the first semiconductor nanocrystal, for example, determined by an inductively coupled plasma atomic emission spectroscopy (ICP-AES) analysis.

The quantum dot may include sulfur in an amount of greater than or equal to about 5 moles, greater than or equal to about 6 moles, greater than or equal to about 7 moles, greater than or equal to about 8 moles, greater than or equal to about 8.5 moles, or greater than or equal to about 9 moles and less than or equal to about 20 moles, less than or equal to about 15 moles, or less than or equal to about 14 moles, less than or equal to about 13 moles, or less than or equal to about 12 moles, per one mole of the main metal included in the first semiconductor nanocrystal, for example, determined by an inductively coupled plasma atomic emission spectroscopy (ICP-AES) analysis.

The quantum dot may include sulfur in an amount of greater than or equal to about 5 moles, greater than or equal to about 6 moles, greater than or equal to about 7 moles, greater than or equal to about 8 moles, greater than or equal to about 8.5 moles, or greater than or equal to about 9 moles, greater than or equal to about 10 moles, greater than or equal to about 11 moles, or greater than or equal to about 12 moles, per one mole of selenium, for example, determined by an inductively coupled plasma atomic emission spectroscopy (ICP-AES) analysis.

In an embodiment, a method of producing the aforementioned quantum dot includes:

obtaining a first mixture including a core including a first semiconductor nanocrystal, a Group II metal precursor, an organic ligand, and an organic solvent;

heating the first mixture at an activation temperature;

injecting a Group V non-metal precursor to the heated first mixture to obtain a second mixture;

heating the second mixture at a first reaction temperature to form a particle having a first layer including a second semiconductor nanocrystal including a Group II-V compound on a surface of the core;

preparing a third mixture including the particle having a first layer including a Group II-V compound on a surface of the core, a metal and a non-metal precursor for a third semiconductor nanocrystal, an organic ligand, and an organic solvent; and heating the third mixture at a second reaction temperature to form the third semiconductor nanocrystal having a composition different from that of the second semiconductor nanocrystal on the first layer.

Details of the first semiconductor nanocrystal and the core are the same as set forth above. The core including the first semiconductor nanocrystal may be prepared in a suitable method and a preparation method thereof is not particularly limited.

The Group II metal precursor may include a Zn metal powder, an alkylated Zn compound (e.g., a dialkyl zinc such as dimethyl zinc, diethyl zinc), Zn alkoxide, Zn carboxylate (e.g., a C1 to C30 zinc carboxylate such as zinc acetate, zinc oleate, zinc stearate and the like), Zn nitrate, Zn perchlorate, Zn sulfate, Zn acetylacetonate, Zn halide (e.g., zinc bromide, zinc chloride, zinc fluoride, zinc iodide), Zn cyanide, Zn hydroxide, Zn oxide, Zn peroxide, or a combination thereof.

Details of the organic ligand are the same as set forth for the ligand compound.

Types of the organic solvent are not particularly limited and may be selected appropriately for a quantum dot colloidal synthesis. Examples of the organic solvent may include a suitable organic solvent for use in the colloid synthesis and may be a C6 to C22 primary amine such as hexadecylamine; a C6 to C22 secondary amine such as dioctylamine; a C6 to C40 tertiary amine such as a trioctyl amine; a nitrogen-containing heterocyclic compound such as pyridine; a C6 to C40 aliphatic hydrocarbon (e.g., alkane, alkene, alkyne, etc.) such as hexadecane, octadecane, octadecene, or squalane; a C6 to C30 aromatic hydrocarbon such as phenyldodecane, phenyltetradecane, or phenyl hexadecane; a phosphine substituted with a C6 to C22 alkyl group such as trioctylphosphine; a phosphine oxide substituted with a C6 to C22 alkyl group such as trioctylphosphine oxide; a C12 to C22 aromatic ether such as a phenyl ether or a benzyl ether, or a combination thereof, but are not limited thereto.

In the first mixture (or in the second mixture), amounts of the precursors, the ligand compounds, the solvents, and optionally the dopant precursor may be selected in view of the composition of the resulting quantum dots (e.g., the compositional ratio with respect to indium, reaction times, temperatures, or the like).

If desired, the $1^{st}$ mixture may be heated under vacuum or in an inert atmosphere at a predetermined temperature (i.e., the activation temperature). The predetermined temperature may be a temperature of greater than or equal to about 40° C., for example, greater than or equal to about 50° C., greater than or equal to about 60° C., greater than or equal to about 70° C., greater than or equal to about 80° C., greater than or equal to about 90° C., greater than or equal to about 100° C., or greater than or equal to about 120° C. The predetermined temperature may be less than the reaction temperature for forming the first layer, which will be described below. In an embodiment, the activation temperature may be less than or equal to about 150° C. or less than or equal to about 120° C.

The method may further include adding a dopant precursor to the first mixture. The first mixture may be the heated first mixture. The dopant precursor may include a Group IIIA metal (e.g., Al, Ga, Tl, or a combination thereof) other than the indium, a Group IV element (e.g., Ge, Sn, or a combination thereof), titanium, iron, or a combination thereof. The dopant precursor may be in the form of a metal powder, an alkylated metal compound, a metal alkoxide, a metal carboxylate (e.g., gallium oleate), a metal nitrate, a metal perchlorate, a metal sulfate, a metal acetylacetonate, a metal halide (e.g., gallium chloride), a metal cyanide, a metal hydroxide, a metal oxide, a metal peroxide, or a combination thereof.

A Group V non-metal precursor may be added to the first mixture to obtain a second mixture. The Group V non-metal precursor may include tris(trimethylsilyl)phosphine, tris(dimethylamino)phosphine, triethylphosphine, tri butylphosphine, trioctylphosphine, triphenylphosphine, tricyclohexylphosphine, arsenic oxide, arsenic chloride, arsenic sulfate, arsenic bromide, arsenic iodide, nitric oxide, nitric acid, ammonium nitrate, or a combination thereof. The first mixture may not include an indium precursor as the metal precursor.

The second mixture is heated to the first reaction temperature to form a first layer including a second semiconductor nanocrystal including a Group II-V compound on a surface of the core. The first reaction temperature may be greater than or equal to about 120° C., for example, greater than or equal to about 130° C., greater than or equal to about 140° C., greater than or equal to about 150° C., greater than or equal to about 160° C., greater than or equal to about 170° C., greater than or equal to about 180° C., greater than or equal to about 190° C. and less than or equal to about 250° C., for example, less than or equal to about 240° C., less than or equal to about 230° C., less than or equal to about 220° C., or less than or equal to about 210° C. The time for forming the first layer may be controlled appropriately. For example, the time for forming the first layer may be greater than or equal to about 30 minutes, greater than or equal to about 40 minutes, greater than or equal to about 50 minutes, greater than or equal to about 60 minutes, greater than or equal to about 70 minutes, greater than or equal to about 80 minutes, or greater than or equal to about 90 minutes and less than or equal to about 3 hours, or less than or equal to about 2 hours.

The method may further include separating the particles having the first layer as formed on the core. Alternatively, the method may proceed without separating the particles having the first layer as formed on the core.

Then, a third mixture including the particles having the first layer as formed on the core, a metal precursor for a third semiconductor nanocrystal, a non-metal precursor for the third semiconductor nanocrystal and an organic ligand in an organic solvent is prepared. The metal (e.g., a Group II metal) precursor and the non-metal precursor (e.g., a Group VI element or a compound) for the third semiconductor nanocrystal may be selected appropriately and are not particularly limited.

The metal precursor may be in a form of a metal powder, an alkylated metal compound, a metal alkoxide, a metal carboxylate, a metal nitrate, a metal perchlorate, a metal sulfate, a metal acetylacetonate, a metal halide, a metal cyanide, a metal hydroxide, a metal oxide, a metal peroxide, a metal carbonate, or a combination thereof.

Examples of the metal precursor may include, but are not limited to, dimethyl zinc, diethyl zinc, zinc acetate, zinc acetylacetonate, zinc iodide, zinc bromide, zinc chloride, zinc fluoride, zinc carbonate, zinc cyanide, zinc nitrate, a zinc oxide, zinc peroxide, zinc perchlorate, zinc sulfate, zinc stearate, mercury acetate, mercury iodide, mercury bromide, mercury chloride, mercury fluoride, mercury cyanide, mercury nitrate, mercury oxide, mercury perchlorate, mercury sulfate, lead acetate, lead bromide, lead chloride, lead fluoride, lead oxide, lead perchlorate, lead nitrate, lead sulfate, lead carbonate, tin acetate, tin bis(acetylacetonate), tin bromide, tin chloride, tin fluoride, tin oxide, tin sulfate, germanium tetrachloride, germanium oxide, germanium ethoxide, trimethyl gallium, triethyl gallium, gallium acetylacetonate, gallium-trichloride, gallium fluoride, gallium oxide, gallium nitrate, gallium sulfate, trimethyl indium, indium acetate, indium hydroxide, indium chloride, indium oxide, indium nitrate, indium sulfate, thallium acetate, thallium acetylacetonate, thallium chloride, thallium oxide, thallium ethoxide, thallium nitrate, thallium sulfate, and thallium carbonate. One or more metal precursor compounds may be used depending on the composition of the quantum dot to be synthesized.

The non-metal precursor may be appropriately selected without any particular limitation depending on the type of the quantum dot to be synthesized. The non-metal precursor may include a Group V element or compound or a Group VI element or compound. Examples of the non-metal precursor may include, but are not limited to, hexanethiol, octanethiol, decanethiol, dodecanethiol, hexadecanethiol, mercaptopropylsilane, sulfur-trioctylphosphine (S-TOP), sulfur-tributylphosphine (S-TBP), sulfur-triphenylphosphine (S-TPP), sulfur-trioctylamine (S-TOA), trimethylsilylsulfide, ammonium sulfide, sodium sulfide, selenium-trioctylphosphine (Se-TOP), selenium-tributylphosphine (Se-TBP), selenium-triphenylphosphine (Se-TPP), tellurium-tributylphosphine (Te-TBP), tellurium-triphenylphosphine (Te-TPP), tris(trimethylsilyl)phosphine, tris(dimethylamino)phosphine, triethylphosphine, tributylphosphine, trioctylphosphine, triphenylphosphine, tricyclohexylphosphine, arsenic oxide, arsenic chloride, arsenic sulfate, arsenic bromide, arsenic iodide, nitric oxide, nitric acid, ammonium nitrate, or a combination thereof.

Examples of the non-metal precursor may include sulfur, selenium, tellurium, or a combination thereof. For example, the non-metal precursor may include hexanethiol, octanethiol, decanethiol, dodecanethiol, hexadecanethiol, mercaptopropylsilane, sulfur-trioctylphosphine (S-TOP), sulfur-tributylphosphine (S-TBP), sulfur-triphenylphosphine (S-TPP), sulfur-trioctylamine (S-TOA), trimethylsilylsulfide, ammonium sulfide, sodium sulfide, selenium-trioctylphosphine (Se-TOP), selenium-tributylphosphine (Se-TBP), selenium-triphenylphosphine (Se-TPP), tellurium-tributylphosphine (Te-TBP), tellurium-triphenylphosphine (Te-TPP), or a combination thereof.

One or more non-metal precursor compounds may be used depending on the composition of the nanocrystal to be synthesized.

The third mixture may be heated to a second reaction temperature to conduct a reaction between the metal precursor and the non-metal precursor, thereby forming a second layer including the third semiconductor nanocrystal on the first layer. The temperature of the second reaction temperature may be selected in view of the type of the precursor and the composition of the final quantum dot. The second reaction temperature may be greater than or equal to about 250° C., greater than or equal to about 260° C., greater than or equal to about 270° C., greater than or equal to about 280° C., greater than or equal to about 290° C., or greater than or equal to about 300° C. The second reaction temperature may be less than or equal to about 350° C., for example, less than or equal to about 340° C., less than or equal to about 330° C., less than or equal to about 320° C., or less than or equal to about 310° C.

When a non-solvent is added into the obtained final reaction solution, a precipitate is formed and separated (for example, via centrifugation) to obtain the resulting quantum dots. Types of the non-solvent may include, but are not limited to, acetone, ethanol, methanol, or the like.

In an embodiment, a cadmium free quantum dot includes a core including an indium phosphide and a shell disposed on the core and including a Group II-V compound, wherein a molar amount of phosphorous with respect to indium is greater than or equal to 1, for example, greater than or equal to about 1.1 and having a zinc blend crystalline structure.

The core may further include zinc. The cadmium free quantum dot may include an additional amorphous or crystalline shell disposed on the first shell. The additional amorphous or crystalline shell may include a Group II-VI compound, a Group III-V compound, a Group IV-VI compound, a Group IV element or compound, a Group I-III-VI compound, a Group I-II-IV-VI compound, a metal oxide, or a combination thereof.

Examples of the Group II-VI compound, the Group III-V compound, the Group IV-VI compound, the Group IV element or compound, the Group I-III-VI compound, and the Group I-II-IV-VI compound are the same as set forth above. Examples of the metal oxide may include $In_2O_3$, PbO, HgO, MgO, $Ga_2O_3$, $Al_2O_3$, ZnO, $SiO_2$, ZnOS, ZnOSe, ZnOSeS, InPO, InPOS, or a combination thereof.

The cadmium free quantum dot may have a molar amount (i.e., molar ratio) of zinc with respect to the indium that is greater than or equal to about 10, greater than or equal to about 10.2, greater than or equal to about 10.3, greater than or equal to about 10.4, greater than or equal to about 10.5, greater than or equal to about 10.6, greater than or equal to about 10.7, greater than or equal to about 10.8, greater than or equal to about 10.9, or greater than or equal to about 11. The cadmium free quantum dot may not include fluorine, boron, or a combination thereof. The cadmium free quantum dot may not include a halogen. The cadmium free quantum dot may exhibit a quantum efficiency of greater than or equal to about 65%, greater than or equal to about 66%, greater than or equal to about 67%, greater than or equal to about 68%, greater than or equal to about 69%, or greater than or equal to about 70%. Details of the core and the shell may refer to the above description.

In an embodiment, a quantum dot composition includes: the aforementioned (e.g., cadmium free) quantum dots (hereinafter, also referred to as quantum dot); a polymerizable (e.g., photopolymerizable) monomer including a carbon-carbon double bond; and optionally a binder polymer; and optionally an initiator (e.g., a photoinitiator). The composition may further include an organic solvent and/or a liquid vehicle.

In the composition, details for the quantum dots are the same as set forth above. In the composition, the amount of the quantum dot may be selected appropriately in view of the types and amounts of other components in the composition and a final use thereof. In an embodiment, the amount of the quantum dot may be greater than or equal to about 1 weight percent (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt %, based on a total solid content of the composition. The amount of the quantum dot may be less than or equal to about 70 wt %, for example, less than or equal to about 65 wt %, less than or equal to about 60 wt %, less than or equal to about 55 wt %, or less than or equal to about 50 wt %, based on a total solid content of the composition.

In the composition, the binder polymer may include a carboxylic acid group (e.g., a carboxylic acid group containing polymer). In an embodiment, the binder polymer may include:

a copolymer of a monomer combination including a first monomer, a second monomer, and optionally a third monomer, the first monomer having a carboxylic acid group and a carbon-carbon double bond, the second monomer having a carbon-carbon double bond and a hydrophobic moiety and not having a carboxylic acid group, and the third monomer having a carbon-carbon double bond and a hydrophilic moiety and not having a carboxylic acid group;

a multi-aromatic ring-containing polymer including a carboxylic acid group (—COOH) and having a backbone structure in a main chain (e.g., a backbone structure incorporated in the main chain), wherein the backbone structure includes a cyclic group including a quaternary carbon atom and two aromatic rings bound to the quaternary carbon atom;

or a combination thereof.

Examples of the first monomer may include, but are not limited to, acrylic acid, (meth)acrylic acid, maleic acid, itaconic acid, fumaric acid, 3-butenoic acid, and other carboxylic acid vinyl ester compounds. The first monomer may include one or more compounds.

Examples of the second monomer may include, but are not limited to:

alkenyl aromatic compounds such as styrene, α-methyl styrene, vinyl toluene, or vinyl benzyl methyl ether;

unsaturated carboxylic acid ester compounds such as methyl acrylate, methyl (meth)acrylate, ethyl acrylate, ethyl (meth)acrylate, butyl acrylate, butyl (meth)acrylate, benzyl acrylate, benzyl (meth)acrylate, cyclohexyl acrylate, cyclohexyl (meth)acrylate, phenyl acrylate, or phenyl (meth) acrylate;

unsaturated carboxylic acid amino alkyl ester compounds such as 2-amino ethyl acrylate, 2-amino ethyl (meth)acrylate, 2-dimethyl amino ethyl acrylate, or 2-dimethyl amino ethyl (meth)acrylate;

maleimides such as N-phenylmaleimide, N-benzylmaleimide, N-alkylmaleimide;

unsaturated carboxylic acid glycidyl ester compounds such as glycidyl acrylate or glycidyl (meth)acrylate;

vinyl cyanide compounds such as acrylonitrile or methacrylonitrile; and unsaturated amide compounds such as acrylamide or methacrylamide, but are not limited thereto.

As the second monomer, at least one compound may be used.

If present, examples of the third monomer may include 2-hydroxy ethyl acrylate, 2-hydroxy ethyl (meth)acrylate, hydroxy propyl acrylate, hydroxy propyl (meth)acrylate, hydroxy butyl acrylate, and hydroxy butyl (meth)acrylate, but are not limited thereto. The third monomer may include one or more compounds.

In an embodiment, in the binder polymer, an amount of the first repeating unit derived from the first monomer may be greater than or equal to about 5 mole percent (mol %), for example, greater than or equal to about 10 mol %, greater than or equal to about 15 mol %, greater than or equal to about 25 mol %, or greater than or equal to about 35 mol %. In the binder polymer, an amount of the first repeating unit may be less than or equal to about 95 mol %, for example, less than or equal to about 90 mol %, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %.

In the binder polymer, an amount of the second repeating unit derived from the second monomer may be greater than or equal to about 5 mol %, for example, greater than or equal to about 10 mol %, greater than or equal to about 15 mol %, greater than or equal to about 25 mol %, or greater than or equal to about 35 mol %. In the binder polymer, an amount of the second repeating unit may be less than or equal to about 95 mol %, for example, less than or equal to about 90 mol %, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %.

In the binder polymer, an amount of the third repeating unit derived from the third monomer, when present, may be greater than or equal to about 1 mol %, for example, greater than or equal to about 5 mol %, greater than or equal to about 10 mol %, or greater than or equal to about 15 mol %. In the binder polymer, an amount of the third repeating unit, when present, may be less than or equal to about 30 mol %, for example, less than or equal to about 25 mol %, less than or equal to about 20 mol %, less than or equal to about 18 mol %, less than or equal to about 15 mol %, or less than or equal to about 10 mol %.

In an embodiment, the binder polymer may include a copolymer of (meth)acrylic acid and at least one second or third monomer including an (C6-C9 aryl) or (C1-C10 alkyl) (meth)acrylate, hydroxyl(C1-C10 alkyl) (meth)acrylate, or styrene. For example, the binder polymer may include a (meth)acrylic acid/methyl (meth)acrylate copolymer, a (meth)acrylic acid/benzyl (meth)acrylate copolymer, a (meth)acrylic acid/benzyl (meth)acrylate/styrene copolymer, a (meth)acrylic acid/benzyl (meth)acrylate/2-hydroxy ethyl (meth)acrylate copolymer, a (meth)acrylic acid/benzyl (meth)acrylate/styrene/2-hydroxy ethyl (meth)acrylate copolymer, or a combination thereof.

In an embodiment, the carboxylic acid group containing binder may include a multi-aromatic ring-containing polymer as described above. The carboxylic acid group may be bonded to the main chain. The multi-aromatic ring-containing polymer is also known as a cardo binder, which may be synthesized or commercially available (e.g., from Nippon Steel Chemical Co., Ltd.).

The carboxylic acid group-containing binder may have an acid value of greater than or equal to about 50 milligrams of potassium hydroxide (KOH) per gram (mg KOH/g). For example, the carboxylic acid group-containing binder may have an acid value of greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, greater than or equal to about 110 mg KOH/g, greater than or equal to about 120 mg KOH/g, greater than or equal to about 125 mg KOH/g, or greater than or equal to about 130 mg KOH/g, but is not limited thereto. The carboxylic acid group-containing binder may have an acid value of less than or equal to about 250 mg KOH/g, for example, less than or equal to about 240 mg KOH/g, less than or equal to about 230 mg KOH/g, less than or equal to about 220 mg KOH/g, less than or equal to about 210 mg KOH/g, less than or equal to about 200 mg KOH/g, less than or equal to about 190 mg KOH/g, less than or equal to about 180 mg KOH/g, or less than or equal to about 160 mg KOH/g, but is not limited thereto.

The binder polymer (e.g., containing the carboxylic acid group, such as the carboxylic acid group-containing binder) may have a molecular weight of greater than or equal to about 1,000 grams per mole (g/mol), for example, greater than or equal to about 2,000 g/mol, greater than or equal to about 3,000 g/mol, or greater than or equal to about 5,000 g/mol. The binder polymer may have a molecular weight of less than or equal to about 100,000 g/mol, for example, less than or equal to about 50,000 g/mol.

In the composition, if present, an amount of the carboxylic acid group-containing binder may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt %, based on the total weight of the composition. In an embodiment, an amount of the carboxylic acid group-containing binder may less than or equal to about 50 wt %, less than or equal to about 40 wt %, less than or equal to about 35 wt %, less than or equal to about 33 wt %, or less than or equal to about 30 wt %, based on the total weight of the composition. The amount of the binder polymer may be greater than or equal to about 0.5 wt % and less than or equal to about 55%, based on a total solid content of the composition.

In the composition according to an embodiment, the (photo)polymerizable monomer having at least one (e.g., at least two, at least three, or more) carbon-carbon double bond may include a (meth)acrylate monomer. Examples of the monomer may include, but are not limited to, C1-C10-alkyl (meth)acrylate, ethylene glycol di(meth)acrylate, triethylene glycol di(meth)acrylate, diethylene glycol di(meth)acrylate, 1,4-butanediol di(meth)acrylate, 1,6-hexanediol di(meth)acrylate, neopentyl glycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy(meth)acrylate, bisphenol A di(meth)acrylate, trimethylolpropane tri(meth)acrylate, ethylene glycol monomethyl ether (meth)acrylate, novolac epoxy (meth)acrylate, propylene glycol di(meth)acrylate, tris(meth)acryloyloxyethyl phosphate, or a combination thereof.

The amount of the monomer may be greater than or equal to about 0.5 wt %, for example, greater than or equal to about 1 wt %, or greater than or equal to about 2 wt % with respect to a total weight of the composition. The amount of the photopolymerizable monomer may be less than or equal to about 50 wt %, for example, less than or equal to about 40 wt %, less than or equal to about 30 wt %, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt % with respect to a total weight of the composition.

The (photo) initiator included in the composition may be a compound that can initiate a radical polymerization of the (photo)polymerizable monomer and/or a thiol compound (e.g., by light). Types of the initiator are not particularly limited and may be selected appropriately. For example, the initiator may be a photo-initiator and may include a triazine compound, an acetophenone compound, a benzophenone compound, a thioxanthone compound, a benzoin compound, an oxime compound, an aminoketone compound, a phosphine or phosphine oxide compound, a carbazole compound, a diketone compound, a sulfonium borate compound, a diazo compound, a diimidazole compound, or a combination thereof, but it is not limited thereto. As an alternative to, or in addition to the foregoing photoinitiators, a carbazole compound, a diketone compound, a sulfonium borate compound, an azo compound (e.g., diazo compound), a biimidazole compound, or a combination thereof may be used as a photoinitiator.

In the composition, an amount of the initiator may be adjusted in view of the types and the amount of the photopolymerizable monomer used. In an embodiment, the amount of the initiator may be greater than or equal to about 0.01 wt % or greater than or equal to about 1 wt % and less than or equal to about 10 wt %, less than or equal to about 9 wt %, less than or equal to about 8 wt %, less than or equal to about 7 wt %, less than or equal to about 6 wt %, or less than or equal to about 5 wt % based on a total weight of the composition, but is not limited thereto.

The composition may be a photosensitive composition.

The (photosensitive) composition may further include a thiol compound having at least one thiol group (e.g., mono-thiol or multi-thiol compound), a metal oxide particle, or a combination thereof.

A plurality of metal oxide fine particles may be present. The metal oxide fine particle(s) may include $TiO_2$, $SiO_2$, $BaTiO_3$, $Ba_2TiO_4$, $ZnO$, or a combination thereof. An amount of the metal oxide fine particle may be less than or equal to about 25 wt %, less than or equal to about 20 wt %, less than or equal to about 15 wt % and greater than or equal to about 1 wt %, or greater than or equal to about 5 wt % based on a total solid content of the composition. A particle size of the metal oxide fine particle is not particularly limited and may be selected appropriately. The (average) particle size of the metal oxide fine particle(s) may greater than or equal to about 100 nm, greater than or equal to about 150 nm, or greater than or equal to about 200 nm and less than or equal to about 1,000 nm, less than or equal to about 900 nm, or less than or equal to about 800 nm.

The multi-thiol compound may include a dithiol compound, a trithiol compound, a tetrathiol compound, or a combination thereof. For example, the multi-thiol compound may include glycol di-3-mercaptopropionate (e.g., ethylene glycol di-3-mercaptopropionate), glycol dimercaptoacetate (e.g., ethylene glycol di mercaptoacetate), trimethylolpropane tris(3-mercaptopropionate), pentaerythritol tetrakis(3-mercaptopropionate), pentaerythritol tetrakis(2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

Based on a total weight of the composition, an amount of the thiol compound may be less than or equal to about 50 wt %, less than or equal to about 40 wt %, less than or equal to about 30 wt %, less than or equal to about 20 wt %, less than or equal to about 10 wt %, less than or equal to about 9 wt %, less than or equal to about 8 wt %, less than or equal to about 7 wt %, less than or equal to about 6 wt %, or less than or equal to about 5 wt %. The amount of the thiol compound may be greater than or equal to about 0.1 wt %, for example, greater than or equal to about 0.5 wt %, greater than or equal to about 1 wt %, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, or greater than or equal to about 10 wt %, based on a total weight of the composition.

The composition may further include an organic solvent and/or a liquid vehicle (hereinafter, simply referred to as "organic solvent"). Types of the organic solvent and/or the liquid vehicle are not particularly limited. Types and amounts of the organic solvent may be appropriately selected by considering the aforementioned main components (i.e., the quantum dot, the COOH group-containing binder, the photopolymerizable monomer, the photoinitiator, and if used, the thiol compound), and types and amounts of additives which will be described below. The composition may include a solvent in a residual amount except for a desired amount of the solid content (non-volatile components). The solvent may be appropriately selected by considering the other components (e.g., a binder, a photopolymerizable monomer, a photoinitiator, and other additives) in the composition, affinity for an alkali-developing solution, a boiling point, and the like. Examples of the solvent and the liquid vehicle may include, but are not limited to: ethyl 3-ethoxy propionate; an ethylene glycol such as ethylene glycol, diethylene glycol, or polyethylene glycol; a glycol ether such as ethylene glycol monomethyl ether, ethylene glycol monoethyl ether, diethylene glycol monomethyl ether, ethylene glycol diethyl ether, and diethylene glycol dimethyl ether; glycol ether acetates such as ethylene glycol monomethyl ether acetate, ethylene glycol monoethyl ether acetate, diethylene glycol monoethyl ether acetate, and diethylene glycol monobutyl ether acetate; a propylene glycol such as propylene glycol; a propylene glycol ether such as propylene glycol monomethyl ether, propylene glycol monoethyl ether, propylene glycol monopropyl ether, propylene glycol monobutyl ether, propylene glycol dimethyl ether, dipropylene glycol dimethyl ether, propylene glycol diethyl ether, and dipropylene glycol diethyl ether; a propylene glycol ether acetate such as propylene glycol monomethyl ether acetate and dipropylene glycol monoethyl ether acetate; an amide such as N-methylpyrrolidone, dimethyl formamide, and dimethyl acetamide; a ketone such as methyl ethyl ketone (MEK), methyl isobutyl ketone (MIBK), and cyclohexanone; a petroleum product such as toluene, xylene, and solvent naphtha; an ester such as ethyl acetate, propyl acetate, butyl acetate, cyclohexyl acetate, and ethyl lactate; an ether such as diethyl ether, dipropyl ether, and dibutyl ether; chloroform, a C1 to C40 aliphatic hydrocarbon (e.g., alkane, alkene, or alkyne), a halogen (e.g., chloro) substituted C1 to C40 aliphatic hydrocarbon (e.g., dichloroethane, trichloromethane, and the like), a C6 to C40 aromatic hydrocarbon (e.g., toluene, xylene, and the like), a halogen (e.g., chloro) substituted C6 to C40 aromatic hydrocarbon, or a combination thereof.

The composition may further include various additives such as a light diffusing agent, a leveling agent, or a coupling agent, in addition to the aforementioned components. The amount of the additive is not particularly limited, and may be selected within an appropriate range, wherein the additive does not cause an adverse effect on the preparation of the composition, the preparation of the quantum dot polymer composite, and optionally, the patterning of the composite. Types and examples of the aforementioned additives may include a suitable compound having a desired function and are not particularly limited.

If present, the amount of the additives may be, based on a total weight of the composition (or a solid content of the composition) greater than or equal to about 0.1 wt %, for example, greater than or equal to about 0.5 wt %, greater than or equal to about 1 wt %, greater than or equal to about 2 wt %, or greater than or equal to about 5 wt %, but it is not limited thereto. If present, the amount of the additives may be less than or equal to about 20 wt %, for example, less than or equal to about 19 wt %, less than or equal to about 18 wt %, less than or equal to about 17 wt %, less than or equal to about 16 wt %, or less than or equal to about 15 wt %, but it is not limited thereto.

The composition may be prepared by mixing the aforementioned components appropriately.

The composition may provide a quantum dot polymer composite or a quantum dot (composite) pattern via polymerization (e.g., photopolymerization).

In an embodiment, a quantum dot polymer composite may include a polymer matrix; and the aforementioned quantum dots dispersed in the polymer matrix.

The polymer matrix may include a binder polymer; a polymerization product of a photopolymerizable monomer including at least one (e.g., at least two, three, four, or five or more) carbon-carbon double bond (s), a polymerization product of the photopolymerizable monomer and a multi-thiol compound having at least two thiol groups at the terminal ends of the multi-thiol compound; or a combination thereof. In an embodiment, the polymer matrix may include a crosslinked polymer and optionally (a carboxylic acid group containing) binder polymer. The crosslinked polymer may include a thiolene polymer, a (meth)acrylate polymer, or a combination thereof. In an embodiment, the crosslinked polymer may include a polymerization product of the aforementioned photopolymerizable monomer and optionally the multi-thiol compound. Details of the binder polymer are the same as set forth above.

Details of the quantum dot, the binder polymer, the photopolymerizable monomer, the multi-thiol compound are the same as set forth above.

The quantum dot polymer composite may be in a form of a film or a sheet. The film of the quantum dot polymer composite or a pattern thereof may have, for example, a thickness of less than or equal to about 30 micrometers (μm), for example, less than or equal to about 10 μm, less than or equal to about 8 μm, or less than or equal to about 7 μm and greater than about 2 μm, for example, greater than or equal to about 3 μm, greater than or equal to about 3.5 μm, or greater than or equal to about 4 μm.

The sheet may have a thickness of less than or equal to about 1000 μm, for example, less than or equal to about 900 μm, less than or equal to about 800 μm, less than or equal to about 700 μm, less than or equal to about 600 μm, less than or equal to about 500 μm, or less than or equal to about 400 μm. The sheet may have a thickness of greater than or equal to about 10 μm, greater than or equal to about 50 μm, or greater than or equal to about 100 μm.

In an embodiment, a display device includes a light source and a light emitting element (e.g., a photoluminescent element), and the light emitting element includes the above quantum dot-polymer composite, and the light source is configured to provide the light emitting element with incident light. The incident light may have a photoluminescence peak wavelength of greater than or equal to about 440 nm, for example, greater than or equal to about 450 nm and less than or equal to about 460 nm.

Figure 2:
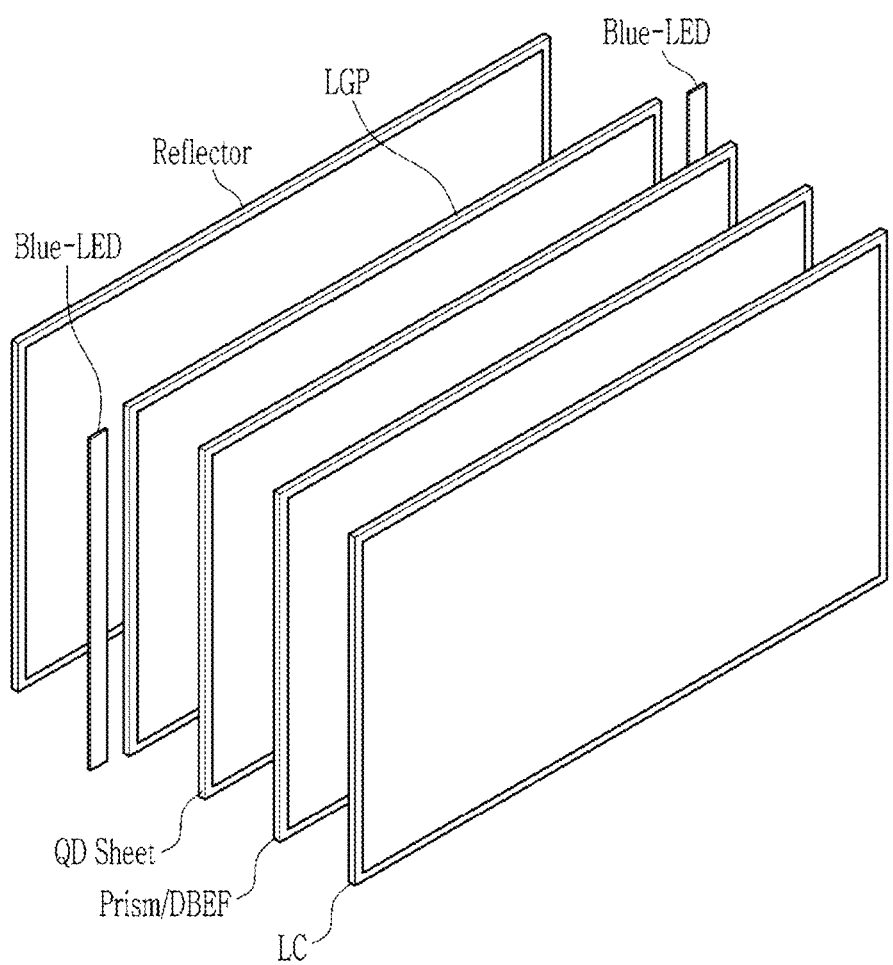
FIG. 2 is an exploded view of a display device according to an embodiment.

In an embodiment, the light emitting element may include a sheet of the quantum dot polymer composite. The display device may further include a liquid crystal panel and the sheet of the quantum dot polymer composite may be disposed between the light source and the liquid crystal panel. FIG. 2 shows an exploded view of a display device. Referring to FIG. 2, the display device may have a structure wherein a reflector, a light guide panel (LGP) and a blue LED light source (Blue-LED), the quantum dot-polymer composite sheet (QD sheet), for example, various optical films such as a prism, double brightness enhance film (DBEF), and the like are stacked and a liquid crystal (LC) panel is disposed thereon.

In an embodiment, the display device may include a stacked structure including a (e.g., transparent) substrate and a light emitting layer (e.g., a photoluminescent layer) disposed on the substrate as a light emitting element. In the stacked structure, the light emitting layer includes a pattern of the quantum dot polymer composite, and the pattern may include at least one repeating section configured to emit light of a predetermined wavelength. The pattern of the quantum dot polymer composite may include a first repeating section that may emit a first light, a second repeating section that may emit a second light, or a combination thereof.

The first light and the second light have a different maximum photoluminescence peak wavelength in a photoluminescence spectrum. In an embodiment, the first light (R) may be red light present at a maximum photoluminescence peak wavelength of about 600 nm to about 650 nm (e.g., about 620 nm to about 650 nm), the second light (G) may be green light present at a maximum photoluminescence peak wavelength of about 500 nm to about 550 nm (e.g., about 510 nm to about 550 nm), or vice versa (i.e., the first light may be a green light and the second light may be a red light).

The substrate may be a substrate including an insulation material. The substrate may include a material of glass; various polymers such as a polyester (e.g., poly(ethylene terephthalate) (PET), poly(ethylene naphthalate) (PEN), or the like), polycarbonate, a poly(C1 to C10(meth)acrylate), polyimide, polyamide, or a combination thereof (a copolymer or a mixture thereof); polysiloxane (e.g., PDMS); an inorganic material such as $Al_2O_3$ or ZnO; or a combination thereof, but is not limited thereto. A thickness of the substrate may be desirably selected considering a substrate material but is not particularly limited. The substrate may have flexibility. The substrate may have a transmittance of greater than or equal to about 50%, greater than or equal to about 60%, greater than or equal to about 70%, greater than or equal to about 80%, or greater than or equal to about 90% for light emitted from the quantum dot.

At least a portion of the substrate may be configured to cut (absorb or reflect) blue light. A layer capable of blocking (e.g., absorbing or reflecting) blue light, also referred to herein as a "blue cut layer" or "blue light absorption layer", may be disposed on at least one surface of the substrate. For example, the blue cut layer (blue light absorption layer) may include an organic material and a predetermined dye, such as, for example, a yellow dye or a dye capable of absorbing blue light and transmitting green and/or red light.

In an embodiment, a method of producing the stacked structure includes
  forming a film of the above composition on a substrate;
  exposing a selected region of the film to light (e.g., having a wavelength of less than or equal to about 400 nm); and
  developing the exposed film with an alkali developing solution to obtain a pattern of the quantum dot polymer composite.

The substrate and the composition have the same specification as described above.

Figure 3:
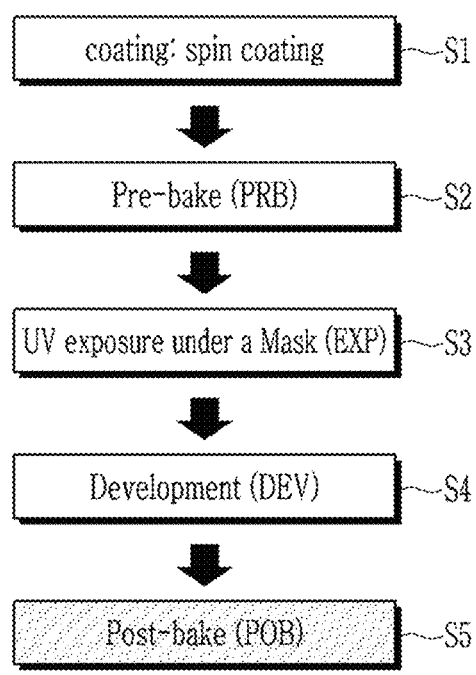
FIG. 3 is a view illustrating a process of producing a quantum dot polymer composite pattern using a composition according to an embodiment.
Figure 3:
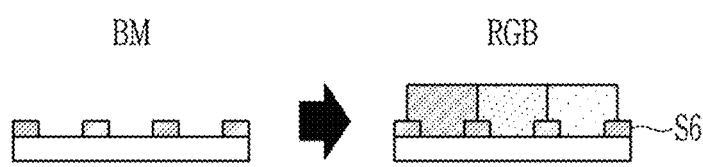

A method of forming a pattern of the quantum dot polymer composite is explained with reference to FIG. 3.

The composition is coated to have a predetermined thickness on a substrate in an appropriate method of spin coating, slit coating, and the like (S1). If desired, the formed film may be pre-baked (S2). Conditions (such as a temperature, a duration, and an atmosphere) for the pre-baking may be selected appropriately.

The formed (and optionally, pre-baked) film is exposed to light of a predetermined wavelength (UV light) under a mask having a predetermined pattern (S3). The wavelength and the intensity of light may be selected depending on the types and the amounts of the photoinitiator, the types and the amounts of quantum dots, or the like.

The film having the exposed selected area is treated (e.g., sprayed or immersed) with an alkali developing solution (S4), and thereby the unexposed region in the film is dissolved to provide a desired pattern. The obtained pattern may be post-baked (S5), if desired, to improve crack resistance and solvent resistance of the pattern, for example, at a temperature of about 150° C. to about 230° C. for a predetermined time, for example, greater than or equal to about 10 min or greater than or equal to about 20 min.

When the quantum dot-polymer composite pattern has a plurality of repeating sections, a quantum dot-polymer composite having a desired pattern may be obtained by preparing a plurality of compositions including a quantum dot (e.g., a red light emitting quantum dot, a green quantum dot, or optionally, a blue quantum dot) having desired photoluminescence properties (a photoluminescence peak wavelength and the like) to form each repeating section and repeating the pattern formation process for each of the composition as many times (e.g., twice or more or three times or more) as required to form a desired pattern of the quantum dot polymer composite (S6).

In an embodiment, an ink composition of an embodiment including the cadmium free quantum dots and the liquid vehicle may be used to form a pattern. For example, a pattern may be formed by depositing the ink including nanomaterials (e.g., plurality of cadmium free quantum dots) and a liquid vehicle and a monomer on a desired region of a substrate and optionally removing the liquid vehicle and/or conducting a polymerization.

For example, the quantum dot-polymer composite may be in the form of a pattern of at least two different repeating color sections (e.g., RGB sections). Such a quantum dot-polymer composite pattern may be used as a photoluminescence-type color filter in a display device.

In an embodiment, a display device includes a light source and a light emitting element including a stacked structure.

The light source may be configured to provide incident light to the light emitting element including the stacked structure. The incident light may have a wavelength of about 440 nm to about 480 nm such as about 440 nm to about 470 nm. The incident light may be the third light.

In a display device including the stacked structure, the light source may include a plurality of light emitting units respectively corresponding to the first section and the second section, and the light emitting units may include a first electrode and a second electrode facing each other and an electroluminescent layer disposed between the first electrode and the second electrode. The electroluminescent layer may include an organic light emitting material.

For example, each light emitting unit of the light source may include an electroluminescent device (e.g., an organic light emitting diode (OLED)) structured to emit light of a predetermined wavelength (e.g., blue light, green light, or a combination thereof). Structures and materials of the electroluminescent device and the organic light emitting diode (OLED) are not particularly limited.

Figure 4A:
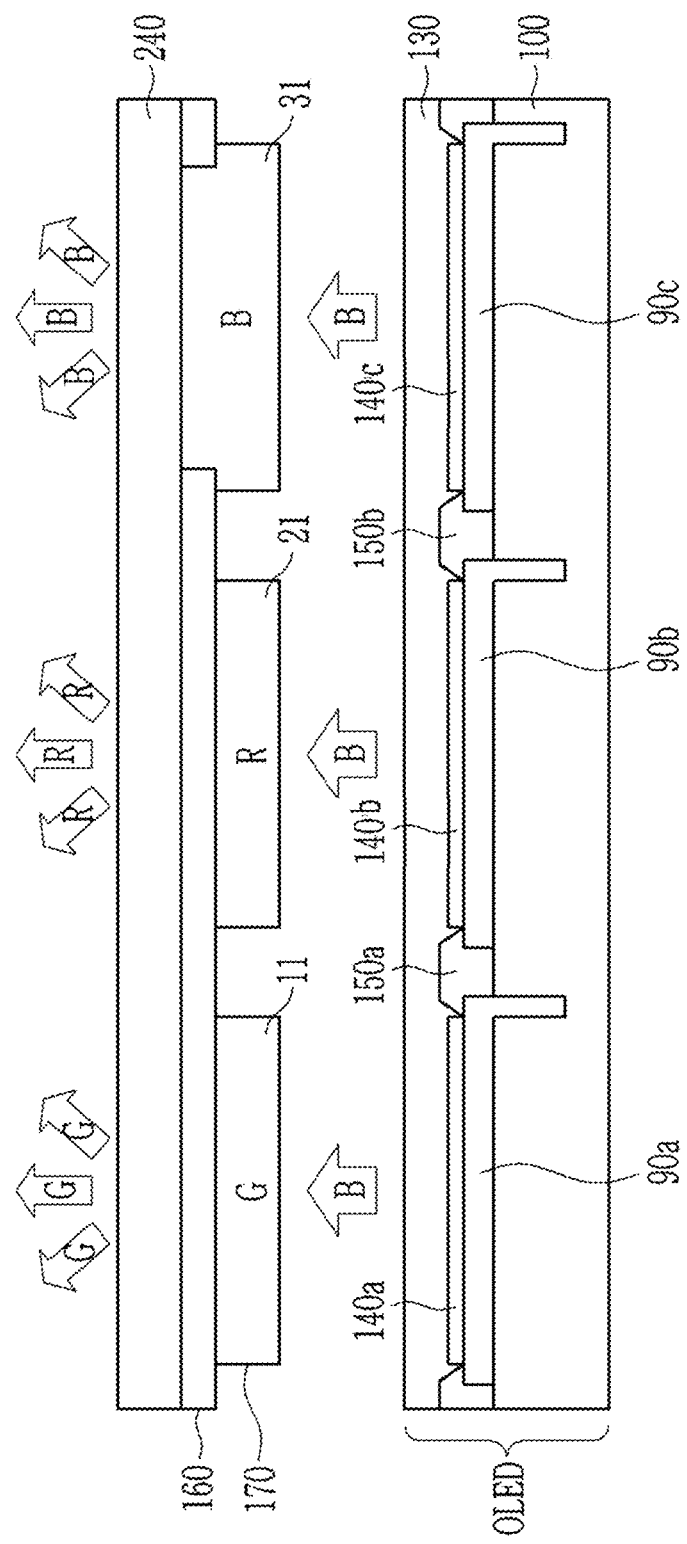
FIG. 4A is a cross-sectional view of a device according to an embodiment.
Figure 4B:
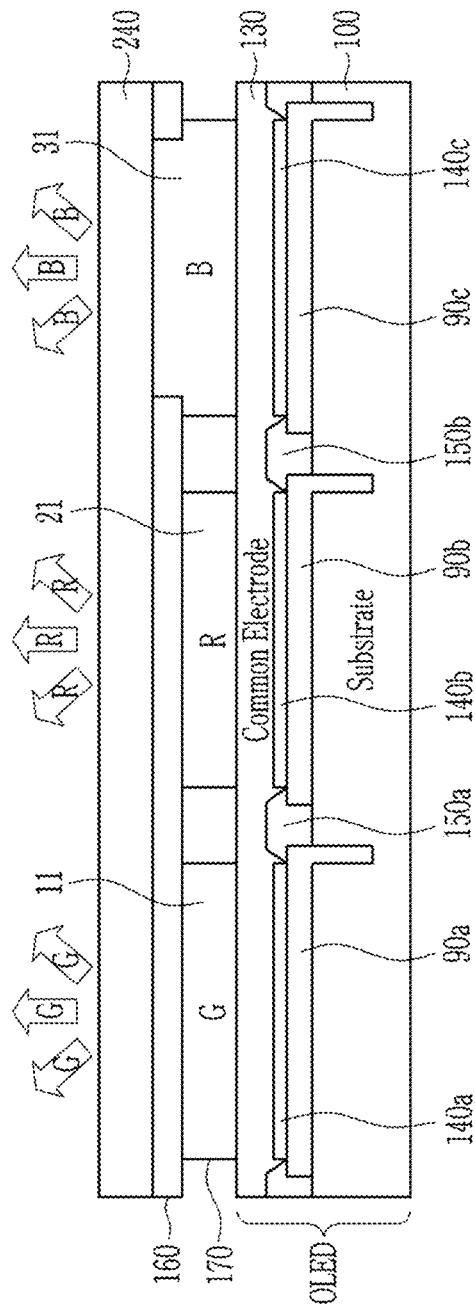
FIG. 4B is a cross-sectional view of a device according to an embodiment.

FIG. 4A and FIG. 4B show a schematic cross-sectional view of a display of an embodiment of a layered structure. Referring to FIG. 4A and FIG. 4B, the light source may include an organic light emitting diode OLED. For example, the OLED may emit blue light or a light having a wavelength in a region of about 500 nm or less. The organic light emitting diode OLED may include (at least two) pixel electrodes 90a, 90b, 90c formed on a substrate 100, a pixel defining layer 150a, 150b formed between the adjacent pixel electrodes 90a, 90b, 90c, an organic light emitting layer 140a, 140b, 140c formed on the pixel electrodes 90a, 90b, 90c, and a common electrode layer 130 formed on the organic light emitting layer 140a, 140b, 140c.

A thin film transistor and a substrate may be disposed under the organic light emitting diode. The pixel areas of the OLED may be disposed corresponding to the first, second, and third sections that will be described in detail below, respectively.

The stacked structure that includes a quantum dot-polymer composite pattern (e.g., including a first repeating section including green light emitting quantum dots and/or a second repeating section including red light emitting quantum dots) and a substrate, or the quantum dot-polymer composite pattern, may be disposed on or over a light source, for example, directly on the light source.

The light (e.g., blue light) emitted from the light source may enter the second section 21 and the first section 11 of the pattern 170 to emit (e.g., converted) red light R and green light G, respectively. The blue light B emitted from the light source passes through or transmits from the third section 31. Over the second section 21 emitting red light and/or the first section 11 emitting green light, an optical element 160 may be disposed. The optical element may be a blue cut layer which cuts (e.g., reflects or absorbs) blue light and optionally green light, or a first optical filter. The blue cut layer 160 may be disposed on the upper substrate 240. The blue cut layer 160 may be disposed between the upper substrate 240 and the quantum dot-polymer composite pattern and over the first section 11 and the second section 21. Details of the blue cut layer are the same as set forth for the first optical filter 310 below.

The aforementioned device may be fabricated by separately preparing the layered structure and the OLED (for example, the blue OLED), respectively, and combining them. Alternatively, the device may be fabricated by directly forming the pattern of the quantum dot-polymer composite over the OLED.

In an embodiment, the display device may further include a lower substrate 210, an optical element (e.g., polarizer) 300 disposed below the lower substrate 210, and a liquid crystal layer 220 interposed between the layered structure and the lower substrate 210. The layered structure may be disposed in such a manner that a light emitting layer (i.e., the quantum dot-polymer composite pattern) faces the liquid crystal layer. The display device may further include an optical element (e.g., polarizer) 300 between the liquid crystal layer 220 and the light emitting layer. The light source may further include an LED and optionally a light guide panel.

Figure 5:
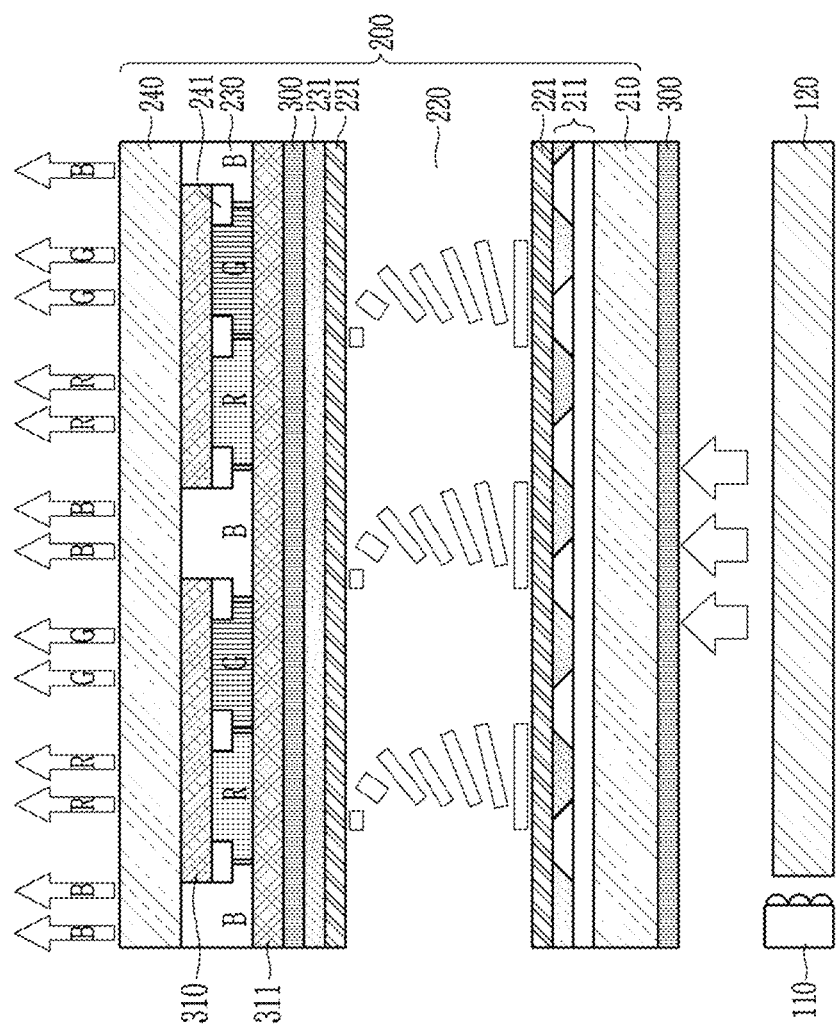
FIG. 5 is a cross-sectional view of a device according to yet an embodiment.

Referring to FIG. 5, in an embodiment, the display device includes a liquid crystal panel 200, an optical element 300 (e.g., polarizer) disposed on and/or under the liquid crystal panel 200, and a backlight unit including a blue light emitting light source 110 under a lower optical element 300. The backlight unit may include a light source 110 and a light guide 120 (edge type). Alternatively, the backlight unit may be a direct light source without a light guide panel (not shown). The liquid crystal panel 200 may include a lower substrate 210, an upper substrate 240, and a liquid crystal layer 220 between the upper and lower substrates, and a light emitting layer (color filter layer) 230 disposed on or under the upper substrate 240. The light emitting layer 230 may include the quantum dot-polymer composite (or a pattern thereof).

A wire plate 211 is provided on an internal surface, for example, on the upper surface of the lower substrate 210. The wire plate 211 may include a plurality of gate wires (not shown) and data wires (not shown) that define a pixel area, a thin film transistor disposed adjacent to a crossing region of gate wires and data wires, and a pixel electrode for each pixel area, but is not limited thereto. Details of such a wire plate are not particularly limited.

The liquid crystal layer 220 may be disposed on the wire plate 211. The liquid crystal layer 220 may include an alignment layer 221 on an upper surface of the liquid crystal layer 220 and on a lower surface of the liquid crystal layer 220, to initially align the liquid crystal material included therein. Details regarding a liquid crystal material, an alignment layer material, a method of forming an alignment layer, a method of forming a liquid crystal layer, a thickness of liquid crystal layer, or the like are not particularly limited.

In an embodiment, an upper optical element or an upper polarizer 300 may be provided between the liquid crystal layer 220 and the upper substrate 240, but it is not limited thereto. For example, the upper optical element or polarizer 300 may be disposed between the liquid crystal layer 220 (or a common electrode 231) and the light emitting layer (or the quantum dot-polymer composite pattern). A black matrix 241 may be provided under the upper substrate 240 (e.g., on a lower surface thereof). Openings within the black matrix 241 are aligned with (or provided to hide) a gate line, a data line, and a thin film transistor of a wire plate 211 on the lower substrate 210. A second section (R) including a color filter emitting red light, a first section (G) including a color filter emitting green light and/or a third section (B) including a color filter for emitting or transmitting blue light may be disposed in the openings within the black matrix 241 (BM). For example, the black matrix 241 may have a lattice shape. If desired, the light emitting layer may further include at least one of a fourth repeating section. The fourth section may be configured to emit light having a color (e.g., cyan, magenta, yellow, or the like) different from the colors of the light emitted from the first to third sections.

The light emitting layer (color filter layer) 230 may be on a transparent common electrode 231.

If desired, the display device may further include a blue cut filter, hereinafter, also referred to as a first optical filter layer. The first optical filter layer 310 may be disposed between upper surfaces of the second section (R) and the first section (G) and the lower surface of the upper substrate 240, or on an upper surface of the upper substrate (240). The first optical filter layer 310 may include a sheet having openings that correspond to the third section (B) (e.g., a pixel area showing, e.g., emitting, a blue color) and may be formed on portions corresponding to the first and second sections (G, R). The first optical filter layer 310 may be formed as a single body structure over the portions of the light emitting layer 230 corresponding to the first and second sections (G, R), and which are other than the portions overlapping the third section, but is not limited thereto. Alternatively, at least two first optical filter layers may be spaced apart from each other and may be disposed over each of the portions overlapping the first and the second sections, respectively.

For example, the first optical filter layer may block light having a predetermined wavelength range in the visible light range and may transmit light having another wavelength range. For example, the first optical filter layer may block blue light and transmit light other than blue light. For example, the first optical filter layer may transmit green light, red light, or yellow light (e.g., the mixed light of the green light and the red light).

The first optical filter layer may include a polymer thin film including a dye and/or a pigment that absorbs light having a specific wavelength, i.e., the wavelength to be blocked. The first optical filter layer may block at least 80%, or at least 90%, even at least 95% of blue light having a wavelength of less than or equal to about 480 nm. With respect to the visible light having other wavelengths, the first optical filter layer may have a light transmittance of greater than or equal to about 70%, for example, greater than or equal to about 80%, greater than or equal to about 90%, or even up to 100%.

The first optical filter layer may absorb and substantially block blue light having a wavelength of less than or equal to about 500 nm, and for example, may selectively transmit green light or red light. In this case, at least two first optical filter layers may be spaced apart and disposed on each of the portions overlapping the first and second sections, respectively. For example, the first optical filter layer selectively transmitting red light may be disposed on the portion overlapping the section emitting red light and the first optical filter layer selectively transmitting green light may be disposed on the portion overlapping the section emitting green light.

In an embodiment, the first optical filter layer may include at least one of a first region and a second region. The first region of the first optical filter layer blocks (e.g., absorbs) blue light and red light and transmits light having a wavelength of a predetermined range, e.g., a wavelength greater than or equal to about 500 nm, greater than or equal to about 510 nm, or greater than or equal to about 515 nm, and less than or equal to about 550 nm, less than or equal to about 540 nm, less than or equal to about 535 nm, less than or equal to about 530 nm, less than or equal to about 525 nm, or less than or equal to about 520 nm. The second region of the first optical filter layer blocks (e.g., absorb) blue light and green light and transmits light having a wavelength of a predetermined range, e.g., a wavelength of greater than or equal to about 600 nm, greater than or equal to about 610 nm, or greater than or equal to about 615 nm and less than or equal to about 650 nm, less than or equal to about 640 nm, less than or equal to about 635 nm, less than or equal to about 630 nm, less than or equal to about 625 nm, or less than or equal to about 620 nm. The first region of the first optical filter layer may be disposed (directly) on or over a location overlapping a green light emitting section and the second region of the first optical filter layer may be disposed (directly) on or over a location overlapping a red light emitting section. The first region and the second region may be optically isolated from one another, for example, by a black matrix. The first optical filter layer may contribute to improving the color purity of a display device.

The first optical filter layer may be a reflection type filter including a plurality of layers (e.g., inorganic material layers) each having a different refractive index. For example, in the first optical filter layer, two layers having different refractive indices may be alternately stacked on each other. For example, a layer having a high refractive index and a layer having a low refractive index may be alternately laminated with each other.

The display device may further include a second optical filter layer 311 (e.g., red/green light or yellow light recycling layer) that is disposed between the light emitting layer 230 and the liquid crystal layer 220, and between the light emitting layer 230—(e.g., the quantum dot polymer composite layer) and the upper polarizer 300. The second optical filter layer 311 may transmit at least a portion of a third light, and reflect at least a portion of a first light and/or a second light. The second optical filter layer may reflect light having a wavelength of greater than 500 nm. The first light may be green (or red) light, the second light may be red (or green) light, and the third light may be blue light.

The display device may show enhanced brightness (e.g., of greater than or equal to about 100 nit) and wide viewing angle (e.g., of greater than or equal to about 160 degrees).

An embodiment provides an electronic device including the quantum dot. The device may include a light emitting diode (LED), an organic light emitting diode (OLED), a sensor, a solar cell, an imaging sensor, or a liquid crystal display (LCD), but is not limited thereto.

Figure 6:
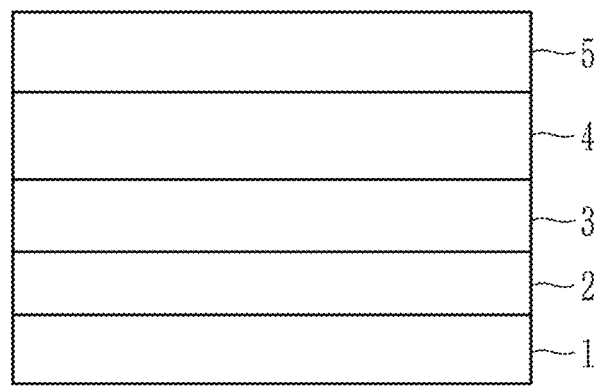
FIG. 6 is a cross-sectional view schematically illustrating an electroluminescent device of an embodiment.

The quantum dots may be used in a luminescent layer in a quantum dot based electroluminescent device (see FIG. 6). The electroluminescent device may include an anode 1 and a cathode 5 facing each other; a quantum dot emission layer 3 disposed between the anode and the cathode and including a plurality of quantum dots, and a hole auxiliary layer 2 disposed between the anode and the quantum dot emission layer. The hole auxiliary layer may include a hole injecting layer (HIL), a hole transporting layer (HTL), an electron blocking layer (EBL), or a combination thereof. The hole auxiliary layer may include a suitable organic/inorganic material having a hole property. The electroluminescent layer may further include an electron auxiliary layer 4 between the cathode and the quantum dot emission layer. The electron auxiliary layer may include an electron injecting layer (EIL), an electron transporting layer (ETL), a hole blocking layer (HBL), or a combination thereof. The electron auxiliary layer may include a suitable organic/inorganic having an electron property.

Hereinafter, embodiments are illustrated in more detail with reference to examples. However, the present disclosure is not limited thereto.

EXAMPLES

Analysis Method
1. Photoluminescence Analysis and UV-Visible Absorption Analysis UV-Visible spectrometer (Agilent Cary Bio 5000) and a fluorescent spectrometer (Hitachi F-7000) are used to perform a photoluminescent analysis and a UV spectroscopy analysis for a quantum dot containing solution and thereby photoluminescence spectrum and UV-Visible absorption spectrum are obtained.
2. X-Ray Photoelectron Spectroscopy An X-ray photoelectron spectroscopy elemental analysis is made for the quantum dots as prepared using Quantum 2000 of Physical Electronics under the following conditions: 0.5-15 kiloelectronvolts (keV), 300 watts (W), minimum analysis region: 200 $\mu m \times 200$ $\mu m$, sputter rate: 0.1 nanometers per minute (nm/min).

3. ICP Analysis

An inductively coupled plasma-atomic emission spectroscopy (ICP-AES) analysis is performed using Shimadzu ICPS-8100.

4. TEM Analysis

A transmission electron microscopic (TEM) analysis is performed using Titan ChemiSTEM electron microscope.

Reference Example 1: Preparation of an In(Zn)P Core 0.2 millimoles (mmol) of indium acetate, 0.25 mmol of zinc stearate, 0.6 mmol of palmitic acid, and 10 milliliters (mL) of 1-octadecene are put in a reactor and heated at 120° C. under vacuum. After 1 hour, an atmosphere in the reactor is converted into nitrogen. The reactor is heated at 280° C., a mixed solution of tris(trimethylsilyl)phosphine (TMS3P, 0.1 mmol) and trioctylphosphine (0.5 mL) is rapidly injected thereinto, and the mixture is reacted for 20 minutes. Subsequently, acetone is added to the reaction solution rapidly cooled down to room temperature, and a precipitate obtained by centrifuging the mixture is dispersed in toluene.

Figure 7:
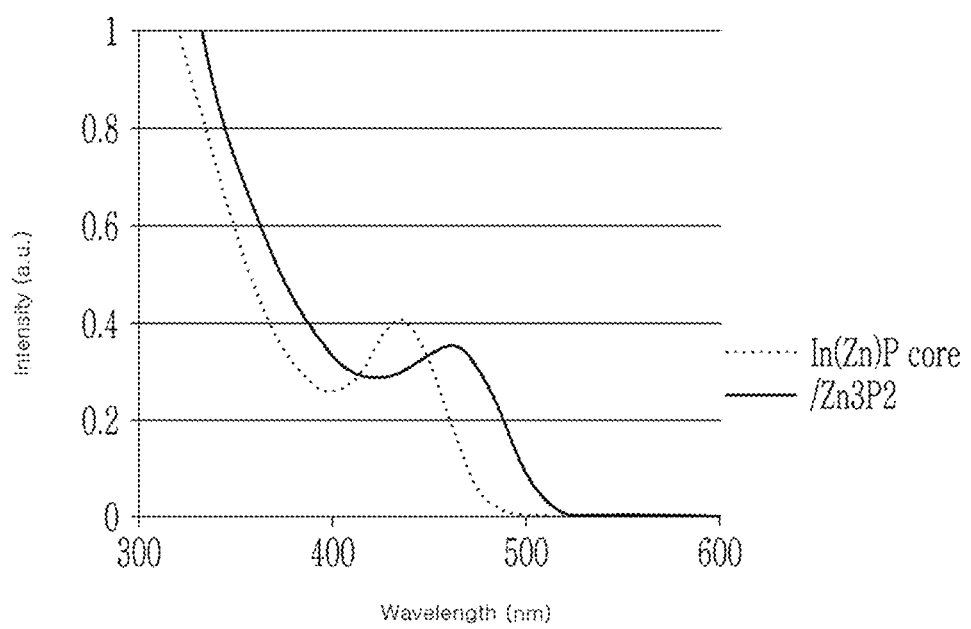
FIG. 7 is a UV-Visible absorption spectrum of the quantum dots prepared in Reference Example 1 and Example 1.
Figure 8:
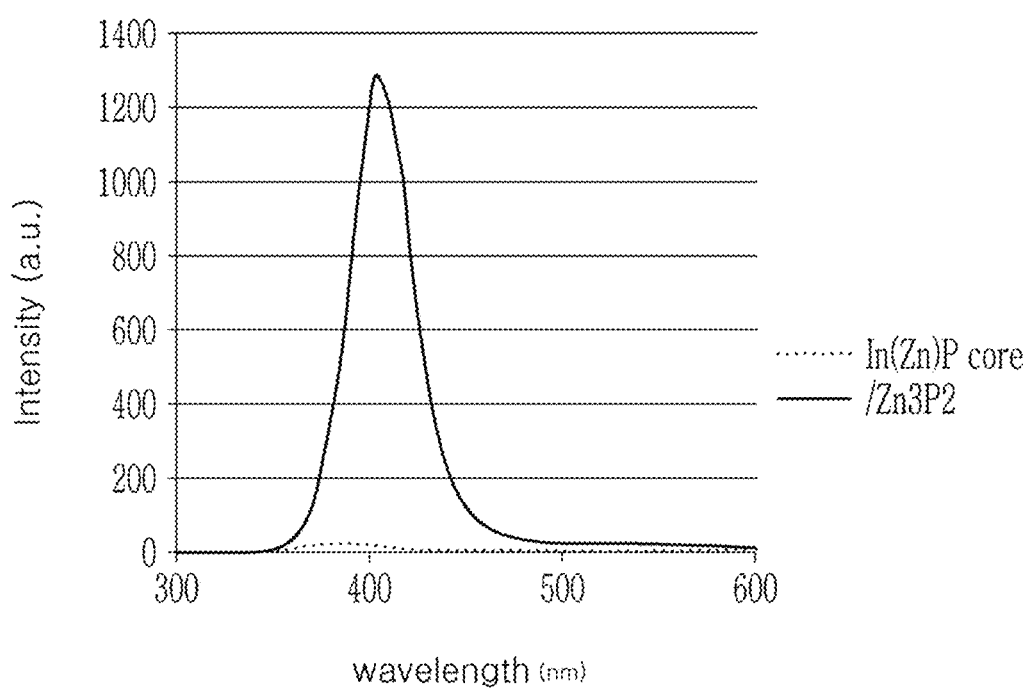
FIG. 8 is a photoluminescent spectrum of the quantum dots prepared in Reference Example 1 and Example 1.

For the obtained In(Zn)P core, a UV-Vis absorption spectroscopic analysis and a photoluminescent analysis are made and the results are shown in FIG. 7, FIG. 8, and Table 1.

For the obtained In(Zn)P core, an ICP-AES analysis is made, and the results are summarized in Table 2.

Figure 9A:
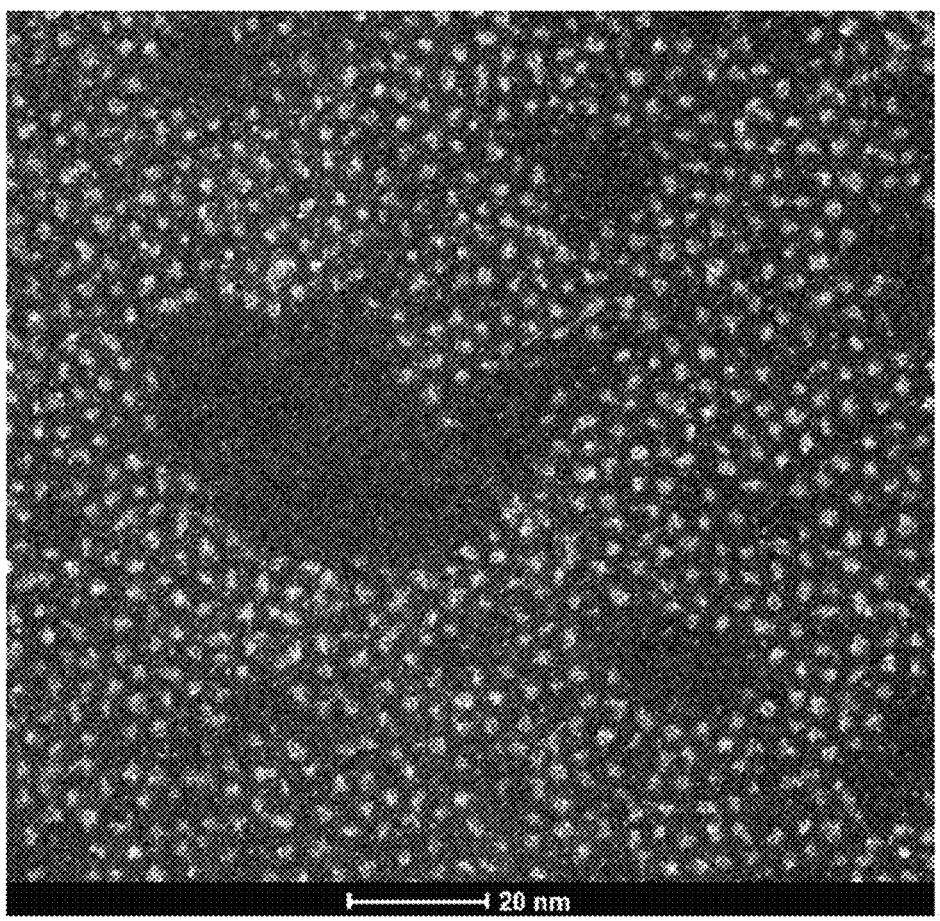
FIG. 9A is a transmission electron microscopic image of the quantum dots prepared in Reference Example 1.

For the obtained In(Zn)P core, a TEM analysis is made, and the results are summarized in FIG. 9a and Table 3.

Example 1

In a 300 mL reaction flask, a toluene dispersion of the InZnP cores prepared in Reference Example 1 (OD=optical density of $1^{st}$ excitonic absorption, OD: 0.15), zinc oleate, and oleic acid are dissolved in trioctyl amine and heated at 120° C. under vacuum for activation. After 30 minutes, a mixed solution of tris(trimethylsilyl)phosphine (TMS3P) and trioctyl phosphine are rapidly injected to the activated solution and a reaction is carried out at a first reaction temperature of 200° C. for at least one hour. The molar ratio between the zinc precursor and the phosphine precursor (Zn:P) is 12:1.

After the completion of the reaction, the reacted solution is cooled to room temperature and ethanol is added thereto to form a precipitation, which is then centrifuged to provide a quantum dot having a ZnP based first layer on the core. The obtained quantum dots are dispersed in chloroform.

For the obtained quantum dots, a UV-Vis absorption spectroscopic analysis and a photoluminescent analysis are made and the results are shown in FIG. 7, FIG. 8, and Table 1.

For the obtained quantum dots, an ICP-AES analysis is made, and the results are summarized in Table 2.

Figure 9B:
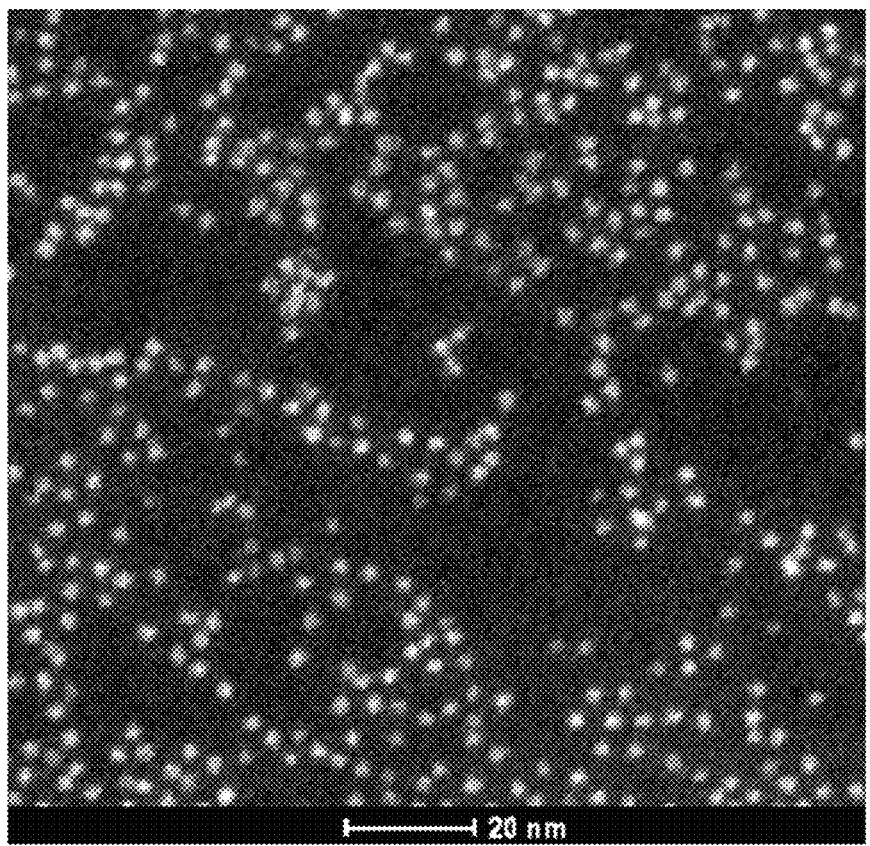
FIG. 9B is a transmission electron microscopic image of the quantum dots prepared in Example 1.

For the obtained quantum dots, a TEM analysis is made, and the results are summarized in FIG. 9B and Table 3.

Example 2

A quantum dot having a first layer of a gallium doped zinc phosphide formed on the core is prepared in the same manner as set forth in Example 1 except for further injecting a gallium chloride solution as a gallium precursor to the activated reaction solution. The molar ratio between the zinc and the gallium (Zn:Ga) is 3:1.

For the obtained quantum dots, a UV-Vis absorption spectroscopic analysis and a photoluminescent analysis are made and the results are shown in Table 1.

For the obtained quantum dots, an ICP-AES analysis is made, and the results are summarized in Table 2.

Example 3

In a 300 mL reaction flask, zinc acetate and oleic acid are dissolved in trioctyl amine and heated at 120° C. under vacuum for activation for 10 minutes. Then, an atmosphere in the reactor is converted into nitrogen and the reaction flask is heated to 280° C.

A toluene dispersion of $In(Zn)P/Zn_3P_2$ quantum dots prepared in Example 1 (OD=optical density of $1^{st}$ excitonic absorption, OD: 0.15) is rapidly injected and then Se/TOP and S/TOP are added subsequently. A reaction is conducted for 30 minutes.

The ratio between the zinc precursor and the Se and S precursors (Zn:S:Se) is about 1:8:8.

After the completion of the reaction, the reacted solution is cooled to room temperature and ethanol is added thereto to form a precipitation, which is then centrifuged to provide a quantum dot having a ZnSeS layer on the first layer. The obtained quantum dots are re-dispersed in chloroform.

For the obtained quantum dots, a photoluminescent analysis is made, and the results are shown in Table 1.

For the obtained quantum dots, an ICP-AES analysis is made, and the results are summarized in Table 2.

Figure 9C:
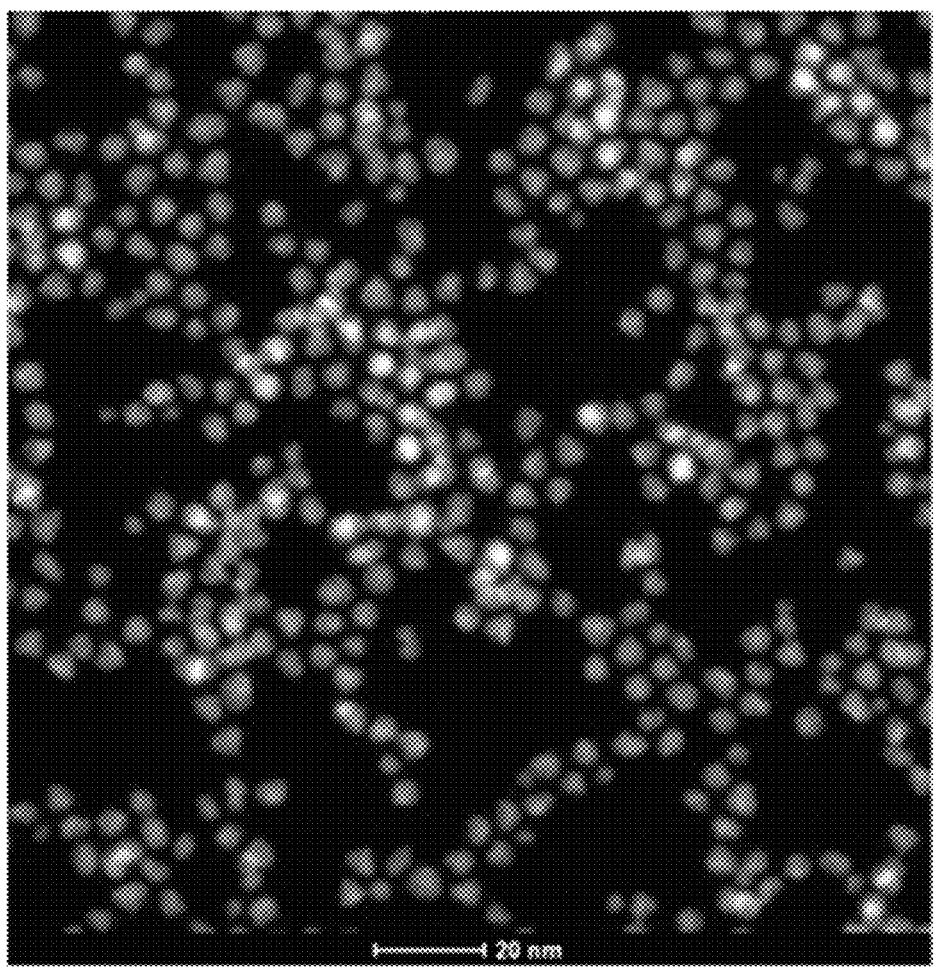
FIG. 9C is a transmission electron microscopic image of the quantum dots prepared in Example 2.

For the obtained quantum dots, a TEM analysis is made, and the results are summarized in FIG. 9C and Table 3.

Example 4

A quantum dot having a ZnSeS layer formed on the first layer of the gallium doped zinc phosphide is prepared in the same manner as set forth in Example 3 except for using a toluene dispersion of the quantum dots prepared in Example 2 (OD=optical density of $1^{st}$ excitonic absorption, OD: 0.15). The obtained quantum dots are re-dispersed in chloroform.

For the obtained quantum dots, a photoluminescent analysis is made, and the results are shown in Table 1.

For the obtained quantum dots, an ICP-AES analysis is made, and the results are summarized in Table 2.

Comparative Example 1

A quantum dot having a ZnSeS layer formed on the core is prepared in the same manner as set forth in Example 3 except for using a toluene dispersion of the quantum dots prepared in Reference Example 1 (OD=optical density of $1^{st}$ excitonic absorption, OD: 0.15).

For the obtained quantum dots, a photoluminescent analysis is made, and the results are shown in Table 1.

For the obtained quantum dots, an ICP-AES analysis is made, and the results are summarized in Table 2.

Figure 9D:
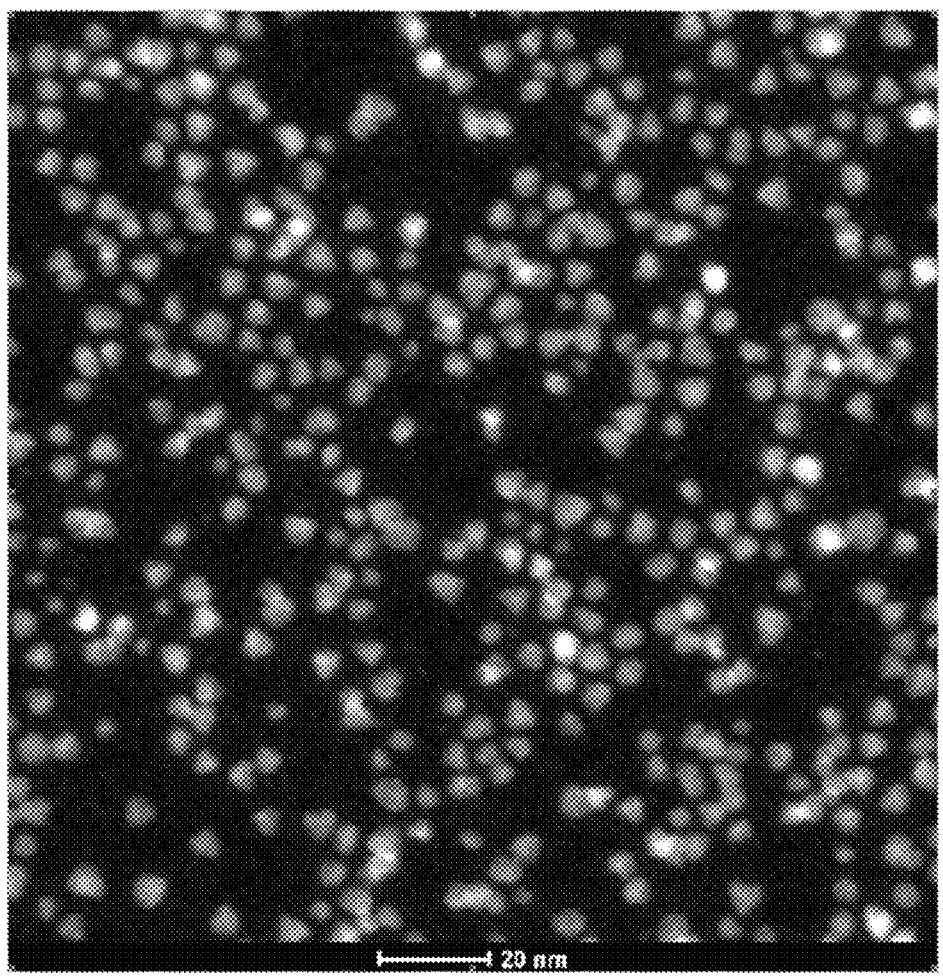
FIG. 9D is a transmission electron microscopic image of the quantum dots prepared in Comparative Example 2.

For the obtained quantum dots, a TEM analysis is made, and the results are summarized in FIG. 9D and Table 3.

TABLE 1

|  | Composition of the Quantum Dot (QD) | abs max (nm) | PL(photoluminescence) max (nm) | Full Width at Half Maximum (FWHM) (nm) | Photoluminescence Quantum Yield (PLQY) (%) |
| --- | --- | --- | --- | --- | --- |
| Ref. Ex 1 | In(Zn)P | 436 | 480 | 48 | 0.4 |
| Example 1 | In(Zn)P/$Zn_3P_2$ | 461 | 503 | 37 | 11 |
| Example 2 | In(Zn)P/$Zn_3P_2$(Ga) | 459 | 500 | 38 | 23 |
| Example 3 | In(Zn)P/$Zn_3P_2$/ZnSeS | 498 | 537 | 47 | 71 |
| Comp. Ex 1 | In(Zn)P/ZnSeS | 473 | 505 | 43 | 51 |
| Example 4 | In(Zn)P/$Zn_3P_2$(Ga)/ZnSeS | 501 | 542 | 53 | 76 |

Results of Table 1, FIG. 7, and FIG. 8 confirm that formation of the first layer including the zinc phosphide may significantly improve the luminous properties (e.g., the full width at half maximum (FWHM) and luminous efficiency) of the quantum dot of Example 1. In addition, forming an additional shell coating on the quantum dot of Example 1 may greatly improve the luminous efficiency in comparison with the quantum dot without the zinc phosphide layer. When a gallium ion is doped in the first layer including the zinc phosphide, the luminous efficiency may further increase and forming a second layer thereon makes it possible to further improve the luminous efficiency of the quantum dot.

TABLE 2

|  | composition | Relative molar ratio | | | | | |
| --- | --- | --- | --- | --- | --- | --- | --- |
|  |  | P/In | Zn/In | In/In | S/In | Se/In | Ga/In |
| Ref. Ex 1 | In(Zn)P | 0.8 | 0.4 | 1.0 | — | — | — |
| Example 1 | In(Zn)P/$Zn_3P_2$ | 1.2 | 1.1 | 1.0 | — | — | — |
| Example 2 | In(Zn)P/$Zn_3P_2$(Ga) | 1.2 | 0.6 | 1.0 |  |  | 0.9 |
| Example 3 | In(Zn)P/$Zn_3P_2$/ZnSeS | 1.0 | 11.5 | 1.0 | 9.7 | 0.7 | — |
| Example 4 | In(Zn)P/$Zn_3P_2$(Ga)/ZnSeS | 1.2 | 11.4 | 1.0 | 9.3 | 0.7 | 0.9 |
| Comp. Ex 1 | In(Zn)P/ZnSeS | 0.7 | 9.3 | 1.0 | 8.8 | 0.6 | — |

Results of Table 2 confirm that formation of the first layer including the zinc phosphide may substantially increase both of the relative ratio of the phosphorous with respect to indium and the relative ratio of the zinc with respect to indium. In the case of the doping of the gallium in the In(Zn)P/$Zn_3P_2$ quantum dot, the relative compositional ratio of P/In may maintain but the relative compositional ratio of Zn/In may decrease and the relative compositional ratio of Ga/In may increase. The doping of the gallium may be kept after the formation of the ZnSeS shell coating. The quantum dots of Example 3 and Example 4 may have a ratio of P/In and a ratio of Zn/In that are higher than those of the quantum dot of Comparative Example 1.

TABLE 3

|  |  | Average Diameter (nm) | Std. dev. | Percentage of standard deviation with respect to the average diameter |
| --- | --- | --- | --- | --- |
| Ref. Ex 1 | In(Zn)P | 1.8 | 0.5 | 27% (= 0.5/1.8) |
| Example 1 | In(Zn)P/$Zn_3P_2$ | 2.4 | 0.4 | 16% (= 0.4/2.4) |
| Example 2 | In(Zn)P/$Zn_3P_2$/ZnSeS | 4.5 | 0.8 | 17% (= 0.8/4.5) |
| Comp. Ex 1 | In(Zn)P/ZnSeS | 4.2 | 0.9 | 21% (=0.9/4.2) # of particles = 208 |

The results of Table 3, and Figures of 9A and 9B confirm that the formation of the first layer including the zinc phosphide may improve the size distribution of the quantum dots as prepared.

The structural analysis via the TEM image confirm that after the coating of $Zn_3P_2$ layer, the quantum dots of Example 1 maintain their shapes closer to a sphere and an average size of the particles may increase from 1.8 nm to 2.4 nm. The introduction of the $Zn_3P_2$ layer may improve the size distribution of the quantum dots.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A quantum dot comprising
a core comprising a first semiconductor nanocrystal and
a multi-layered shell disposed on the core and comprising at least two layers,
wherein the quantum dot does not comprise cadmium;
wherein the first semiconductor nanocrystal comprises a Group III-V compound comprising indium, the multi-layered shell comprises a first layer surrounding at least a portion of a surface of the core, the first layer comprising a second semiconductor nanocrystal, the second semiconductor nanocrystal comprising a Group II-V compound, and a second layer disposed on the first layer, the second layer comprising a third semiconductor nanocrystal, the third semiconductor nanocrystal comprising a composition different from that of the second semiconductor nanocrystal and comprising a Group II-VI compound; and
wherein in the quantum dot, an amount of zinc is greater than or equal to about 9.5 moles, per one mole of the indium.

2. The quantum dot of claim 1, wherein the Group III-V compound further comprises phosphorous.

3. The quantum dot of claim 2, wherein the Group III-V compound further comprises zinc and the zinc is either alloyed or doped in an indium phosphide.

4. The quantum dot of claim 1, wherein in the quantum dot, a molar ratio of phosphorous with respect to indium is greater than or equal to about 1.

5. The quantum dot of claim 1, wherein a bulk energy bandgap of the second semiconductor nanocrystal is greater than or equal to a bulk energy bandgap of the first semiconductor nanocrystal and less than a bulk energy bandgap of the third semiconductor nanocrystal.

6. The quantum dot of claim 1, wherein the second semiconductor nanocrystal comprises a zinc phosphide.

7. The quantum dot of claim 1, wherein the second semiconductor nanocrystal further comprises a Group IIIA metal other than indium, a Group IV element, titanium, iron, or a combination thereof.

8. The quantum dot of claim 1, wherein the first layer is disposed directly on the surface of the core.

9. The quantum dot of claim 1, wherein a thickness of the first layer is less than or equal to about 3 monolayers.

10. The quantum dot of claim 1, wherein the third semiconductor nanocrystal comprises ZnSe, ZnSeS, ZnS, or a combination thereof.

11. The quantum dot of claim 1, wherein the second layer has a composition varying in a radial direction.

12. The quantum dot of claim 1, wherein the multi-layered shell comprises a third layer that is disposed on the second layer, the third layer comprises a fourth semiconductor nanocrystal comprising a composition different from that of the third semiconductor nanocrystal.

13. The quantum dot of claim 12, wherein the fourth semiconductor nanocrystal comprises a compound having an energy bandgap greater than that of the third semiconductor nanocrystal.

14. The quantum dot of claim 1, wherein the quantum dot does not comprise fluorine, boron, or a combination thereof.

15. The quantum dot of claim 1, wherein a quantum efficiency of the quantum dot is greater than or equal to about 65%.

16. A quantum dot population comprising a plurality of the quantum dots of claim 1, wherein the plurality of quantum dots has an average size of greater than or equal to about 4 nanometers and less than or equal to about 6 nanometers and a standard deviation of the size is less than or equal to about 20% of the average size.

17. A quantum dot-polymer composite comprising:
a polymer matrix; and
a plurality of quantum dots dispersed in the polymer matrix;
wherein the plurality of quantum dots comprises the quantum dot of claim 1.

18. The quantum dot-polymer composite of claim 17, wherein the polymer matrix comprises a crosslinked polymer, a binder polymer comprising a carboxylic acid group, or a combination thereof.

19. A display device, which comprises
a light source and
a light emitting element,
wherein the light emitting element comprises the quantum dot-polymer composite of claim 17 and the light source is configured to provide the light emitting element with incident light.

20. The display device of claim 19, wherein the incident light has a luminescence peak wavelength of about 440 nanometers to about 460 nanometers.

21. The display device of claim 19, wherein, the light emitting element comprises a sheet of the quantum dot polymer composite.

22. The display device of claim 19, wherein the light emitting element comprises a stacked structure comprising a substrate and a light emitting layer disposed on the substrate, wherein the light emitting layer comprises a pattern of the quantum dot polymer composite and the pattern comprises at least one repeating section configured to emit light at a predetermined wavelength.

23. The display device of claim 22, wherein the pattern comprises a first section configured to emit a first light and a second section configured to emit a second light having a different center wavelength from the first light.

24. The display device of claim 23, wherein the light source comprises a plurality of light-emitting units corresponding to each of the first section and the second section, wherein the light-emitting units comprise a first electrode and a second electrode facing each other and an electroluminescence layer disposed between the first electrode and the second electrode.

25. The display device of claim 22, wherein the display device further comprises a lower substrate, a polarizer disposed under the lower substrate, and a liquid crystal layer disposed between the stacked structure and the lower substrate, wherein the stacked structure is disposed so that the light emitting layer faces the liquid crystal layer.

* * * * *